(12) United States Patent
Tanaka et al.

(10) Patent No.: US 10,877,342 B2
(45) Date of Patent: Dec. 29, 2020

(54) DISPLAY DEVICE

(71) Applicant: Sharp Kabushiki Kaisha, Sakai (JP)

(72) Inventors: Kohhei Tanaka, Sakai (JP); Ryo Yonebayashi, Sakai (JP); Keisuke Yoshida, Sakai (JP); Takayuki Nishiyama, Sakai (JP); Tokihiro Yokono, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/498,501

(22) PCT Filed: Mar. 29, 2018

(86) PCT No.: PCT/JP2018/013123
§ 371 (c)(1),
(2) Date: Sep. 27, 2019

(87) PCT Pub. No.: WO2018/181665
PCT Pub. Date: Oct. 4, 2018

(65) Prior Publication Data
US 2020/0033684 A1  Jan. 30, 2020

(30) Foreign Application Priority Data
Mar. 30, 2017  (JP) ................. 2017-068695

(51) Int. Cl.
G02F 1/1362 (2006.01)
G02F 1/1333 (2006.01)
(Continued)

(52) U.S. Cl.
CPC ...... *G02F 1/136286* (2013.01); *G02F 1/1368* (2013.01); *G02F 1/13338* (2013.01);
(Continued)

(58) Field of Classification Search
CPC ......... G02F 1/136286; G02F 1/133512; G02F 1/13338; G02F 1/133514; G02F 1/13454;
(Continued)

(56) References Cited

U.S. PATENT DOCUMENTS

2010/0014012 A1* 1/2010 Irie .................... G02F 1/133707
349/39
2012/0057091 A1* 3/2012 Kawabata ............... H04N 5/66
349/38
(Continued)

FOREIGN PATENT DOCUMENTS

WO  2014/069529 A1  5/2014

*Primary Examiner* — Muhammad N Edun
(74) *Attorney, Agent, or Firm* — Keating & Bennett, LLP

(57) ABSTRACT

Provided is a display device in which variation in white balance is suppressed even if wiring lines are arranged in pixels. The display device includes: gate lines; source lines 15S; drive elements connected to the gate lines and the source lines 15S; pixel electrodes connected to the drive elements; and color filters provided corresponding to the pixel electrodes. The pixel electrodes are provided in one-to-one correspondence with subpixels, and a plurality of subpixels 18R, 18G, and 18B constitute one pixel. The display device further includes wiring lines L provided in a pixel region so as to extend along either the gate lines or the source lines. At least some of the wiring lines L are arranged in pixel aperture regions of the subpixels 18. The arrangement pitch P1 of the wiring lines L is larger than the pixel pitch (3×Sa).

15 Claims, 21 Drawing Sheets

(51) Int. Cl.
*G02F 1/1335* (2006.01)
*G02F 1/1345* (2006.01)
*G02F 1/1368* (2006.01)
*G06F 3/041* (2006.01)
*G09G 3/36* (2006.01)
*H01L 27/12* (2006.01)
*G06F 3/044* (2006.01)

(52) U.S. Cl.
CPC ...... *G02F 1/13452* (2013.01); *G02F 1/13454* (2013.01); *G02F 1/133512* (2013.01); *G02F 1/133514* (2013.01); *G02F 1/136227* (2013.01); *G06F 3/0412* (2013.01); *G09G 3/3607* (2013.01); *G09G 3/3677* (2013.01); *H01L 27/124* (2013.01); *H01L 27/1225* (2013.01); *G02F 2201/40* (2013.01); *G06F 3/044* (2013.01); *G09G 2300/0465* (2013.01); *G09G 2320/0242* (2013.01)

(58) Field of Classification Search
CPC ........... G02F 1/13452; G02F 1/136227; G02F 2201/40; G02F 1/1368; G06F 3/0412; G06F 3/044; G06F 3/04166; G06F 3/0443; H01L 27/1225; H01L 27/124; G09F 9/30; G09G 2300/0465; G09G 3/3607; G09G 3/2088; G09G 2320/0242; G09G 2300/0408; G09G 2300/0426; G09G 3/3648; G09G 3/3677
See application file for complete search history.

(56) References Cited

U.S. PATENT DOCUMENTS

| | | | |
|---|---|---|---|
| 2015/0293546 A1 | 10/2015 | Tanaka et al. | |
| 2017/0177125 A1* | 6/2017 | Kim | H01L 27/3262 |
| 2017/0192328 A1* | 7/2017 | Cho | H01L 29/78633 |
| 2017/0285386 A1* | 10/2017 | Ono | G02F 1/133514 |

* cited by examiner

DISPLAY DEVICE

TECHNICAL FIELD

The present invention relates to a display device, and more particularly, to a display device in which wiring lines are arranged in pixels.

BACKGROUND ART

Conventionally, a display device in which a drive circuit is provided outside a pixel region (i.e., in a so-called frame region) is known. In recent years, a display device in which at least part of a drive circuit is provided in a pixel region is also known (see Patent Literature 1, for example).

CITATION LIST

Patent Literature

Patent Literature 1: WO 2014/069529

SUMMARY OF INVENTION

Technical Problem

Patent Literature 1 discloses, as one embodiment, a configuration in which elements constituting gate drivers are arranged in pixels of a specific color (e.g., blue pixels) (see FIGS. 57 and 58 etc. of Patent Literature 1). In this case, wiring lines for supplying control signals to the elements are also arranged in the pixels of the specific color (e.g., blue pixels).

However, if any wiring line is arranged in a pixel as described above, the transmittance of the pixel is reduced. In particular, when wiring lines are arranged in pixels of a specific color as in the above-described configuration, the transmittances of the pixels of that color become uneven owing to variation in width among the wiring lines and misalignment of the wiring lines during manufacturing. This causes a problem of variation in white balance.

In light of the above-described problem, it is an object of the present invention to provide a display device in which variation in white balance is suppressed even if wiring lines of some kind are arranged in pixels.

Solution to Problem

A display device disclosed in the following includes: gate lines; source lines; drive elements connected to the gate lines and the source lines; pixel electrodes connected to the drive elements; and color filters provided corresponding to the pixel electrodes. The pixel electrodes are provided in one-to-one correspondence with subpixels, and a plurality of subpixels constitute one pixel. The display device further includes wiring lines provided in a pixel region so as to extend along either the gate lines or the source lines. At least some of the wiring lines are arranged in pixel aperture regions of the subpixels. An arrangement pitch of the wiring lines is larger than a pixel pitch.

Advantageous Effects of Invention

According to the following disclosure, it is possible to provide a display device in which variation in white balance is suppressed even if wiring lines of some kind are arranged in pixels.

DESCRIPTION OF EMBODIMENTS

Figure 1:
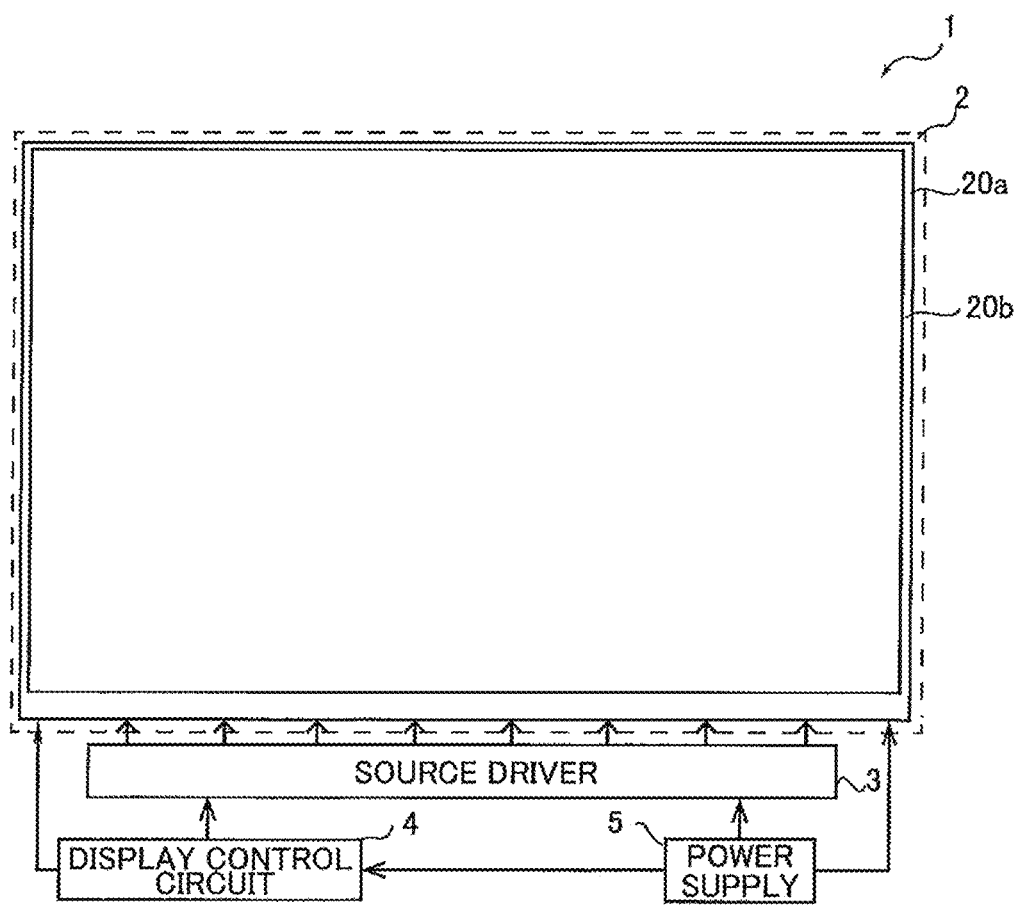
FIG. 1 is a schematic view showing a schematic configuration of a display device according to a first embodiment.

A display device according to the first configuration includes: gate lines; source lines; drive elements connected to the gate lines and the source lines; pixel electrodes connected to the drive elements; and color filters provided corresponding to the pixel electrodes. The pixel electrodes are provided in one-to-one correspondence with subpixels, and a plurality of subpixels constitute one pixel. The display device further includes wiring lines provided in a pixel region so as to extend along either the gate lines or the source lines. At least some of the wiring lines are arranged in pixel aperture regions of the subpixels. An arrangement pitch of the wiring lines is larger than a pixel pitch.

In the first configuration, the arrangement pitch of the wiring lines arranged in the pixel aperture regions of the subpixels is larger than the pixel pitch. With this configuration, as compared with a conventional configuration in which the arrangement pitch of wiring lines arranged in pixel aperture regions of subpixels is equal to the pixel pitch, the degree of reduction in aperture ratio is small. Furthermore, since the arrangement pitch of the wiring lines is larger than the pixel pitch, unlike the configuration in which the arrangement pitch of the wiring lines is equal to the pixel pitch, the degree of concentration of the wiring lines on the subpixels of a specific color only is reduced. Therefore, even if variation in width among the wiring lines or misalignment of the wiring lines occurs during manufacturing, variation in aperture ratio among the subpixels of a plurality of colors is small, and accordingly, variation in white balance is also small.

The wiring lines provided in the pixel region extend along either the gate lines or the source lines. The extending direction of these wiring lines may be parallel with either the gate lines or the source lines, but need not be strictly parallel with them. That is, the extending direction of the wiring lines may incline at a slight angle with respect to either the gate lines or the source lines, or alternatively, the wiring lines or either the gate lines or the source lines may have parts that extend at a different angle from the extending direction.

A second configuration is a configuration in which, in the first configuration, the wiring lines are arranged in the pixel aperture regions of the subpixels of all of the plurality of colors.

According to the second configuration, even if variation in width among the wiring lines or misalignment of the wiring lines occurs during manufacturing, a similar degree of change is caused in the aperture ratios of the subpixels of the plurality of colors. Therefore, as compared with the conventional configuration in which the wiring lines are arranged in subpixels of a specific color, variation in white balance is small.

A third configuration is a configuration in which, in the first configuration, the wiring lines are arranged in the pixel aperture regions of the subpixels of a specific color among the plurality of colors.

According to the third configuration, the arrangement pitch of the wiring lines arranged in the pixel aperture regions of the subpixels is larger than the pixel pitch. Thus, even if the wiring lines are arranged in the subpixels of a specific color, the degree of reduction in aperture ratio is small as compared with the conventional configuration in which the arrangement pitch of the wiring lines is equal to the pixel pitch. Accordingly, variation in white balance is suppressed.

A fourth configuration is a configuration in which, in any of the first to third configurations, the display device further includes a black matrix provided corresponding to regions where the gate lines and the source lines are formed, and in each subpixel with the wiring line arranged therein, at least one of a black matrix opening length and a black matrix opening width is greater than that in each subpixel without the wiring line arranged therein.

According to the fourth configuration, in each subpixel with the wiring line arranged therein, at least one of the black matrix opening length and the black matrix opening width is set to be greater than that in each subpixel without the wiring line arranged therein. With this configuration, it is possible to compensate for the reduction in aperture ratio due to the presence of the wiring lines. Accordingly, the difference in luminance caused by arranging the wiring lines in the pixel aperture regions is reduced, whereby the streaky display unevenness and the like can be suppressed.

A fifth configuration is a configuration in which, in any of the first to third configurations, a size of each subpixel with the wiring line arranged therein in a width direction of the wiring line is greater than that of each subpixel without the wiring line arranged therein.

According to the fifth configuration, the size of each subpixel with the wiring line arranged therein in the width direction of the wiring line is greater than that of each subpixel without the wiring line arranged therein. With this configuration, the reduction in aperture ratio caused by arranging the wiring lines in the pixel aperture regions of the subpixels can be compensated for by increasing the areas of the pixel aperture regions of the subpixels. Accordingly, the difference in luminance caused by arranging the wiring lines in the pixel aperture regions is reduced, whereby the streaky display unevenness and the like can be suppressed.

A sixth configuration is a configuration in which, in any of the first to fifth configurations, the color filters are laid out in a stripe arrangement.

A seventh configuration is a configuration in which, in any of the first to fifth configurations, a minimum unit of repetition of colors of the color filters includes at least two colors in an extending direction of the source lines and at least two colors in an extending direction of the gate lines.

A eighth configuration is a configuration in which, in any of the first to seventh configurations, the display device further includes a gate driver for driving the gate lines, at least one of switching elements included in the gate driver are arranged in the pixel region, and at least one of the wiring lines are connected to the switching elements.

According to the eighth configuration, also in the display device configured such that at least one of the switching elements of the gate driver is arranged in the pixel region, even if variation in width or misalignment occurs in the wiring lines connected to the switching elements during manufacturing, variation in aperture ratio among the subpixels of the plurality of colors is small, and accordingly, variation in white balance is also small.

A ninth configuration is a configuration in which, in any of the first to eighth configurations, the display device further includes a common electrode facing the pixel electrodes, and at least one of the wiring lines are connected to the common electrode.

According to the ninth configuration, even if variation in width or misalignment occurs in the wiring lines connected to the common electrode during manufacturing, variation in aperture ratio among the subpixels of the plurality of colors is small, and accordingly, variation in white balance is also small.

A tenth configuration is a configuration in which, in any of the first to ninth configurations, the display device further includes a touch electrode for touch detection, and at least one of the wiring lines are connected to the touch electrode.

According to the tenth configuration, even if variation in width or misalignment occurs in the wiring lines connected to the common electrode during manufacturing, variation in aperture ratio among the subpixels of the plurality of colors is small, and accordingly, variation in white balance is also small.

The eleventh configuration is a configuration in which, in any one of the first to seventh, ninth and tenth configurations, the display device further includes a gate driver for driving the gate lines, the gate driver is arranged outside the pixel region in an extending direction of the source lines, and at least one of the wiring lines connect the gate driver and the gate lines.

According to the eleventh configuration, even if variation in width or misalignment occurs in the wiring lines that connect the gate driver and the gate lines during manufacturing, variation in aperture ratio among the subpixels of the plurality of colors is small, and accordingly, variation in white balance is also small. In addition, as compared with a configuration in which a gate driver is provided in a frame region (outside the pixel region) located in the extending direction of gate lines, the area of the frame region in the extending direction of the gate lines can be made smaller. Moreover, since the gate driver is not present in the frame region in the extending direction of the gate lines, there is also an advantage in that the degree of freedom in designing the shape of the frame regions in the extending direction of the gate lines increases.

A twelfth configuration is a configuration in which, in any of the first to eleventh configurations, the source lines and the wiring lines are formed in the same layer. According to this configuration, it is also possible to form the source lines and the wiring lines by the same process using the same material.

A thirteenth configuration is a configuration in which, in any of the first to eleventh configurations, the source lines and the wiring lines are formed in different layers. This configuration brings about an effect that the parasitic capacitance between the source lines and the wiring lines is reduced, whereby the display quality is improved.

A fourteenth configuration is a configuration in which, in any of the first to thirteenth configurations, the drive elements are each provided with an oxide semiconductor film.

A fifteenth configuration is a configuration in which, in the eighth configuration, the switching elements included in the gate driver are each provided with an oxide semiconductor film.

EMBODIMENTS

Embodiments of the present invention will be described in detail below with reference to the drawings. Components/portions that are identical or equivalent to each other in the drawings are given the same reference numerals, and descriptions thereof are not repeated. For clarity of illustration, in the drawings to be referred to in the following description, structures may be shown in simplified or schematic forms, and some components may be omitted. The dimensional ratios between components shown in the respective drawings do not necessarily represent actual dimensional ratios.

First Embodiment (Configuration of Liquid Crystal Display Device)
FIG. 1 is a schematic view showing a schematic configuration of a liquid crystal display device according to the present embodiment. A liquid crystal display device 1 includes a display panel 2, a source driver 3, a display control circuit 4, and a power supply 5. The display panel 2 includes an active matrix substrate 20a, a counter substrate 20b, and a liquid crystal layer (not shown) interposed between these substrates. Although not shown in FIG. 1, polarizing plates are provided on the lower surface side of the active matrix substrate 20a and on the upper surface side of the counter substrate 20b. On the counter substrate 20b, a black matrix, color filters of three colors, namely, red (R), green (G), and blue (B), and a common electrode are formed (they are all not shown). In the present embodiment, the color filters of the three colors are laid out in a stripe arrangement.

As shown in FIG. 1, the active matrix substrate 20a is electrically connected to the source driver 3 formed on a flexible substrate. The display control circuit 4 is electrically connected to the display panel 2, the source driver 3, and the power supply 5. The display control circuit 4 outputs control signals to the source driver 3 and a below-described drive circuit (hereinafter referred to as "gate driver") formed on the active matrix substrate 20a. The control signals include signals for displaying an image on the display panel 2, such as a reset signal (CLR), clock signals (CKA, CKB), and a data signal. The power supply 5 is electrically connected to the display panel 2, the source driver 3, and the display control circuit 4, and supplies a power supply voltage signal to each of them.

Figure 2:
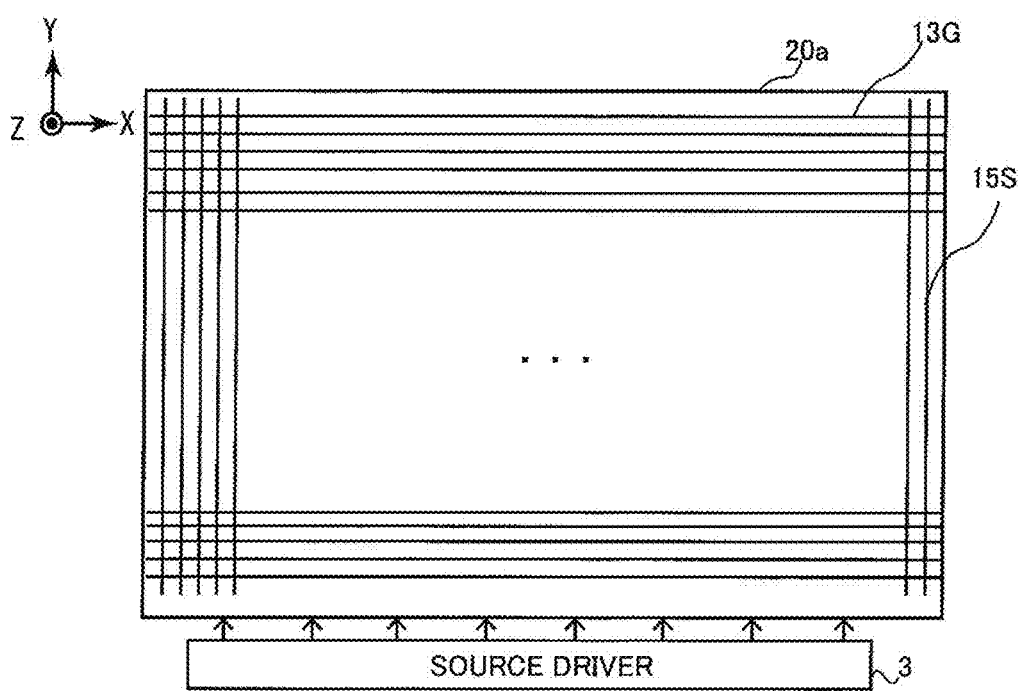
FIG. 2 is a schematic view showing a schematic configuration of an active matrix substrate according to the first embodiment.

(Configuration of Active Matrix Substrate)
FIG. 2 is a schematic view showing a schematic configuration of the active matrix substrate 20a. On the active matrix substrate 20a, a plurality of gate lines 13G extending from one end to the other end of the active matrix substrate 20a in the X direction are formed substantially in parallel with each other at regular intervals. Also, on the active matrix substrate 20a, a plurality of source lines 15S (data lines) are formed so as to cross the group of gate lines 13G. A region surrounded by the gate lines 13G and the source lines 15S constitutes one subpixel. Each subpixel corresponds to any of the colors of the RGB color filters. That is, in the present embodiment, subpixels of the three colors of RGB constitute one pixel.

To the plurality of gate lines 13G, selection signals are sequentially input from the gate driver. Although not shown in FIG. 1, in the first embodiment, the gate driver is provided at one end of the active matrix substrate 20a in the X direction. It is to be noted that gate drivers may be provided at both ends of the active matrix substrate 20a in the X direction, and the selection signal may be input from both ends of each gate line 13G. Alternatively, a gate driver may be provided outside the active matrix substrate 20a (on the flexible substrate or any other substrate).

Figure 3:
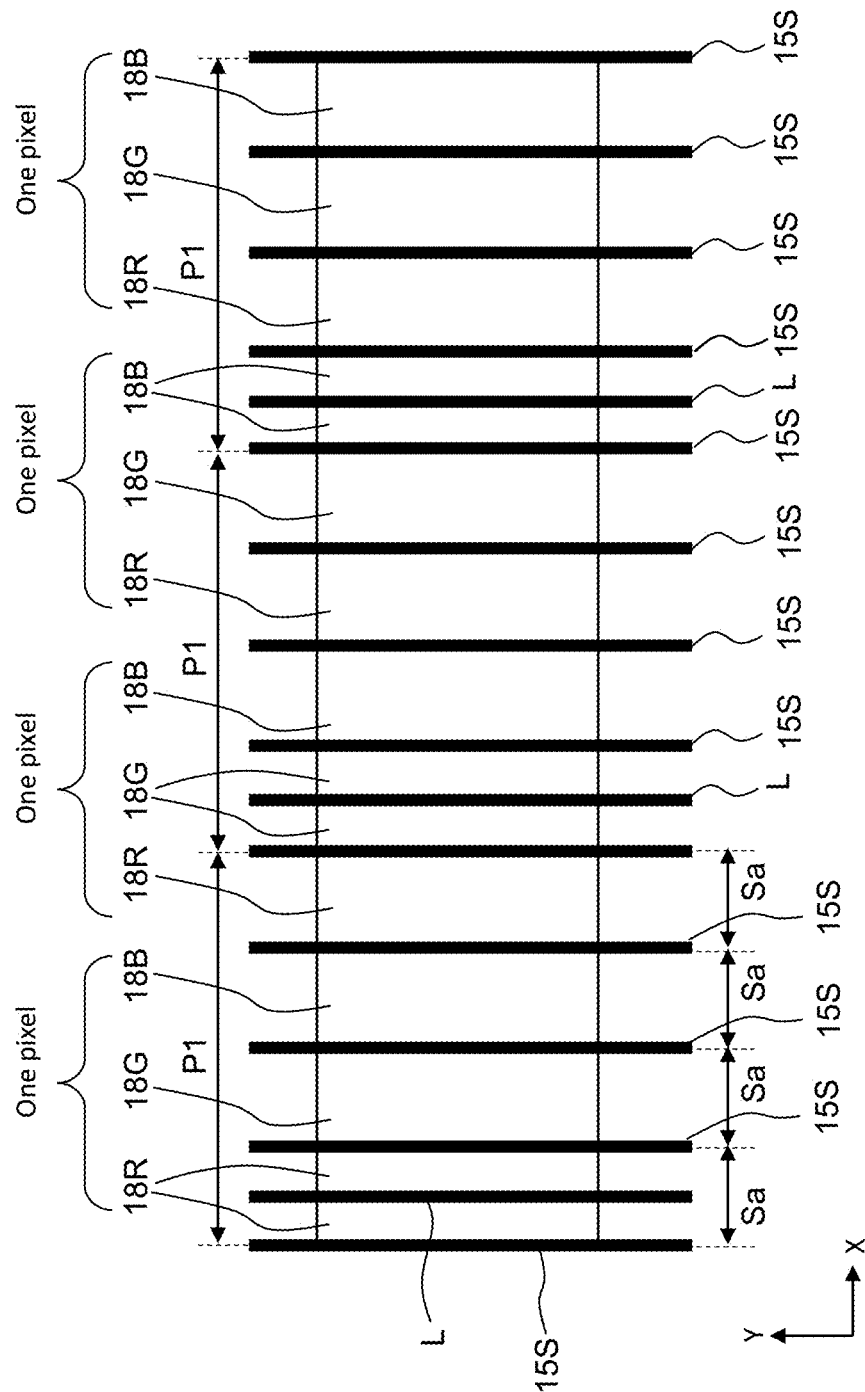
FIG. 3 is a schematic view showing the relative arrangement between pixels and wiring lines in the liquid crystal display device of the first embodiment.

(Arrangement of Pixels and Wiring Lines)
FIG. 3 is a schematic view showing the relative arrangement between the pixels and the wiring lines in the liquid crystal display device of the first embodiment. As shown in FIG. 3, on the active matrix substrate 20a of the first embodiment, red subpixels 18R, green subpixels 18G, and blue subpixels 18B are laid out in a stripe arrangement. In the following description, when it is not necessary to distinguish the colors of the subpixels 18R, 18G, and 18B, they are simply referred to as the subpixels 18.

In the present embodiment, the widths of the subpixels 18R, 18G, and 18B are uniform (Sa shown in FIG. 3). On the active matrix substrate 20a, in addition to the plurality of source lines 15S, a plurality of wiring lines L are provided. The wiring lines L are wiring lines that can be selected freely and have a function different from that of the source lines 15S. The wiring lines L extend in parallel with the source lines 15S. The plurality of wiring lines L are arranged at regular intervals in the extending direction of the gate lines (the X direction in FIG. 3).

As shown in FIG. 3, one wiring line L is arranged for every four subpixels 18. That is, the arrangement pitch P1 of the wiring lines L is set to 4Sa, which is larger than the pixel pitch (3Sa). Although FIG. 3 shows an example where the arrangement pitch P1 of the wiring lines L is 4Sa, the arrangement pitch P1 of the wiring lines L is not limited as long as it is larger than the pixel pitch (3Sa).

In the example shown in FIG. 3, the arrangement pitch P1 of the wiring lines L is 4Sa. With this configuration, among three pixels that are adjacent to each other in the X direction in FIG. 3, in the left pixel the wiring line L is located in the red subpixel 18R. In the central pixel, the wiring line L is located in the green subpixel 18G. In the right pixel, the wiring line L is located in the blue subpixel 18B. That is, in the example shown in FIG. 3, the wiring lines L are present in the subpixels 18 of all the colors of RGB. Besides, the wiring lines L are present in the subpixels 18 of all the colors of RGB in substantially equal proportions. Accordingly, as compared with a configuration in which wiring lines are arranged in pixels (subpixels) of a specific color as in the above-described conventional configuration, even if variation in width among the wiring lines L or misalignment of the wiring lines L occurs during manufacturing, the influence thereof on white balance is small because a similar degree of change is caused in the aperture ratios of the subpixels of the respective colors of RGB.

Moreover, since the arrangement pitch P1 of the wiring lines L is larger than the pixel pitch 3Sa, there is an advantage in that the degree of reduction in aperture ratio is small as compared with the above-described conventional configuration in which the arrangement pitch of the wiring lines L is equal to the pixel pitch.

In the example shown in FIG. 3, the source lines 15S are all arranged between the subpixels (i.e., in regions where light is shielded by a black matrix), and the wiring lines L are arranged in the subpixels (light-transmitting regions). However, as long as the condition that the arrangement pitch of the wiring lines L is larger than the pixel pitch is satisfied, one or more of the source lines 15S may be arranged in the subpixel(s) (light-transmitting region(s)) and one or more of the wiring lines may be arranged between the subpixels (in the region(s) where light is shielded by the black matrix). The same applies to each of the following embodiments.

Second Embodiment

Figure 4:
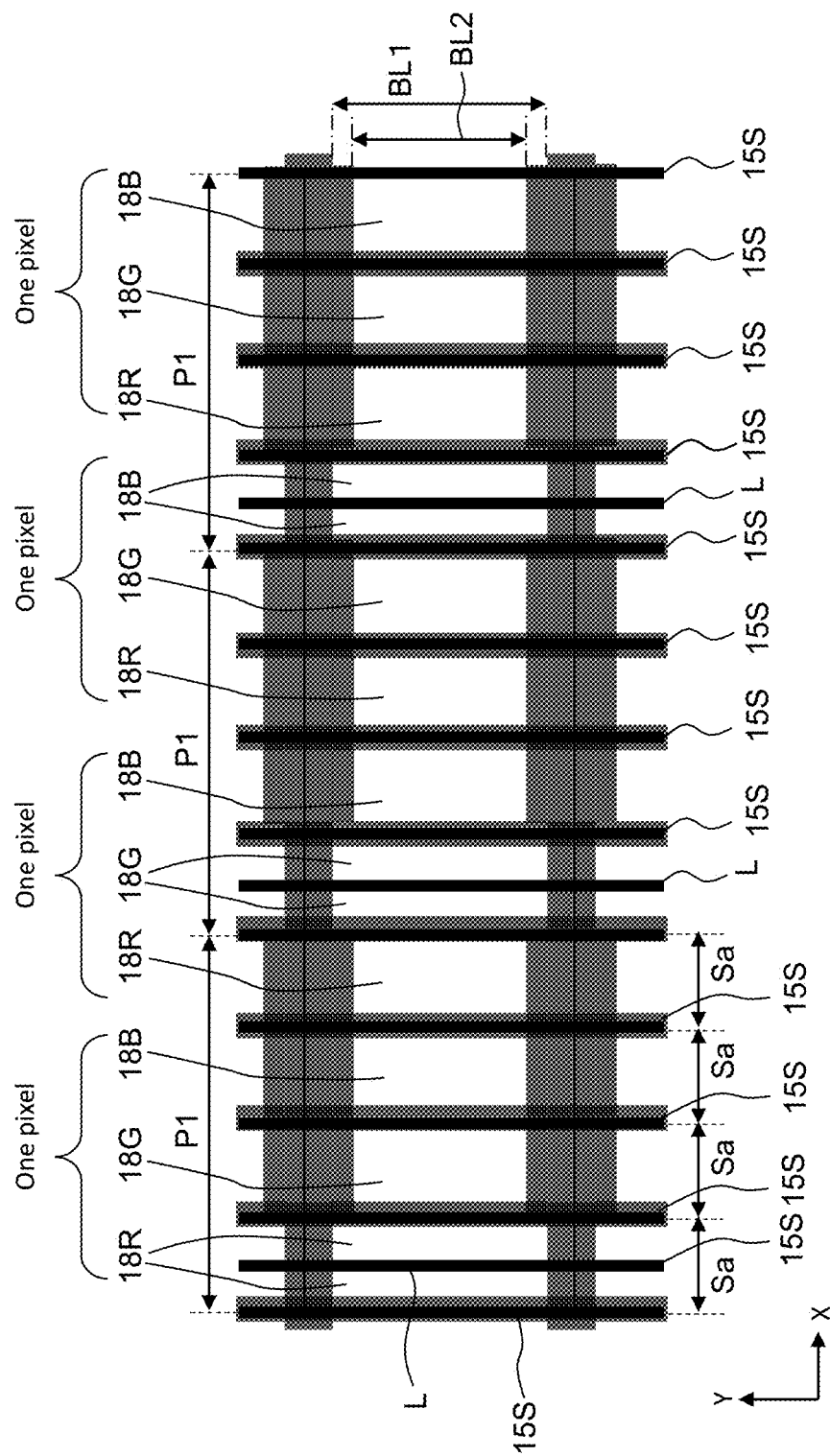
FIG. 4 is a schematic view showing the relative arrangement between pixels and wiring lines in a liquid crystal display device of a second embodiment.

FIG. 4 is a schematic view showing the relative arrangement between pixels and wiring lines in a liquid crystal display device of the second embodiment. In the second embodiment, the relative arrangement between pixels and wiring lines in an active matrix substrate 20a is as shown in FIG. 3 in the first embodiment. However, the second embodiment is difference from the first embodiment in that at least one of a black matrix opening width and a black matrix opening length is set to be different between each subpixel with a wiring line L arranged therein and each subpixel without a wiring line L arranged therein, thereby reducing the difference in aperture ratio between each subpixel with the wiring line L arranged therein and each subpixel without the wiring line L arranged therein.

The term "black matrix opening width" as used herein means the length in the X direction of a portion of a subpixel not covered with the black matrix. The term "black matrix opening length" means the length in the Y direction of the portion of the subpixel not covered with the black matrix.

For example, in the example shown in FIG. 4, the black matrix opening length BL1 in each subpixel 18 with the wiring line L arranged therein is set to be larger than the black matrix opening length BL2 in each subpixel 18 without the wiring line L arranged therein, whereby the aperture ratio of each subpixel 18 with the wiring line L arranged therein is made equal to the aperture ratio of each subpixel 18 without the wiring line L arranged therein. That is, in each subpixel 18 with the wiring line L arranged therein, the aperture area is reduced owing to the presence of the wiring line L in the pixel aperture region, and in order to compensate for this reduction, the black matrix opening length therein is set to be larger than that in each subpixel 18 without the wiring line L arranged therein. In the example shown in FIG. 4, the black matrix opening widths of all the subpixels 18 are uniform.

In the example shown in FIG. 4, the aperture ratio is adjusted by varying the black matrix opening length. However, the opening length may be set uniform, and the opening width may be varied. More specifically, the black matrix opening width in each subpixel with the wiring line L arranged therein may be set to be larger than that in each subpixel without the wiring line L arranged therein. Alternatively, both the opening width and the opening length may be set to be different between each subpixel with the wiring line L arranged therein and each subpixel without the wiring line L arranged therein.

By setting at least one of the black matrix opening width and the black matrix opening length to be different between each subpixel with the wiring line L arranged therein and each subpixel without the wiring line L arranged therein as described above, variation in aperture ratio among the subpixels can be suppressed. With this configuration, in addition to the effects of the first embodiment, it is possible to effectively suppress streaky display unevenness observed when the aperture ratio varies among the subpixels depending on the presence or absence of the wiring line L in the subpixels.

Third Embodiment

Figure 5:
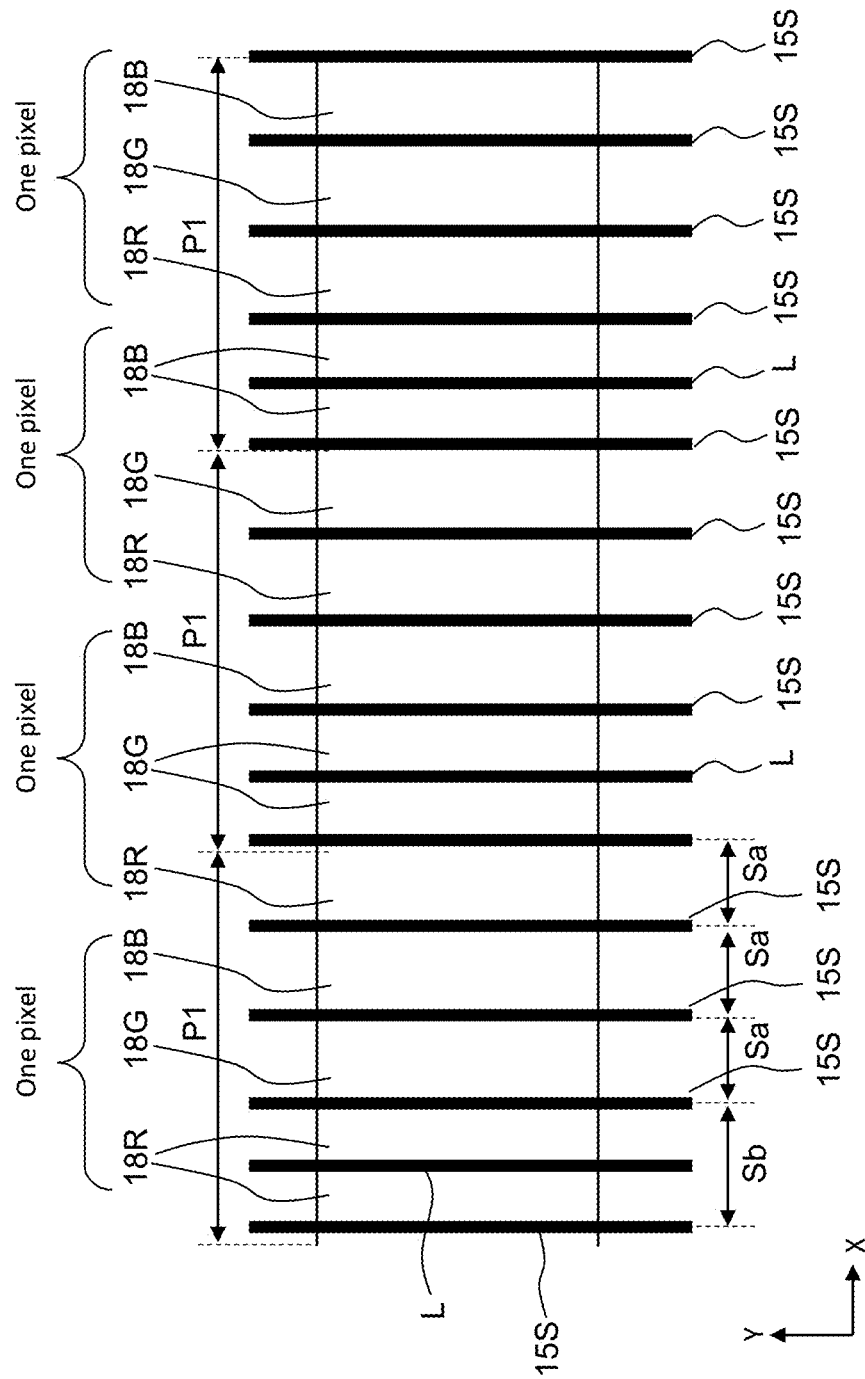
FIG. 5 is a schematic view showing the relative arrangement between pixels and wiring lines in a liquid crystal display device of a third embodiment.

FIG. 5 is a schematic view showing the relative arrangement between pixels and wiring lines in a liquid crystal display device of the third embodiment. In the third embodiment, the relative arrangement between pixels and wiring lines in an active matrix substrate 20a is similar to that shown in FIG. 3 in the first embodiment. However, the third embodiment is difference from the first embodiment in that the size of each subpixel with a wiring line L arranged therein in the width direction of the wiring line L (i.e., the width of each subpixel) is set to be larger than that of each subpixel without a wiring line L arranged therein.

That is, as shown in FIG. 5, in the active matrix substrate 20a of the third embodiment, the width Sb of each subpixel 18 with the wiring line L arranged therein is greater than the width Sa of each subpixel 18 without the wiring line L arranged therein.

Furthermore, it is preferable that the width Sb of each subpixel 18 with the wiring line L arranged therein, the width Sa of each subpixel 18 without the wiring line L arranged therein, and the width w of each wiring line L satisfy the following relational expression:

$$Sa=Sb-w.$$

According to this configuration, each subpixel 18 with the wiring line L arranged therein and each subpixel 18 without the wiring line L arranged therein can have the same aperture ratio. With this configuration, in addition to the effects of the first embodiment, it is possible to more effectively suppress streaky display unevenness observed when the aperture ratio varies among the subpixels depending on the presence or absence of the wiring line L in the subpixels.

Fourth Embodiment

Figure 6:
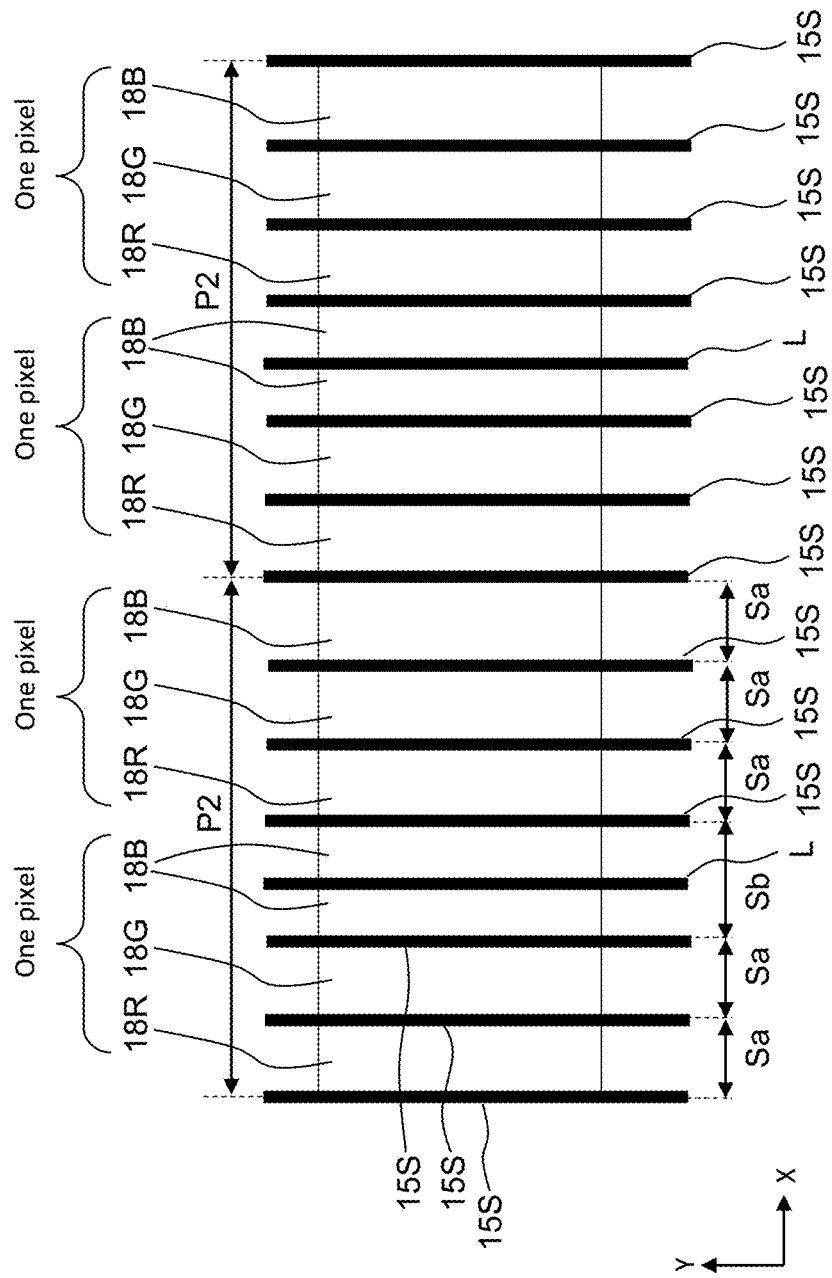
FIG. 6 is a schematic view showing the relative arrangement between pixels and wiring lines in a liquid crystal display device of a fourth embodiment.

FIG. 6 is a schematic view showing the relative arrangement between pixels and wiring lines in a liquid crystal display device of the fourth embodiment. Also in the fourth embodiment, the arrangement pitch of wiring lines L is set to be larger than the pixel pitch as in the first embodiment. However, in the fourth embodiment, one wiring line L is arranged for every six subpixels 18. The wiring line L is arranged in one of two blue subpixels 18B included in the six subpixels.

That is, in the configuration shown in FIG. 6, the arrangement pitch P2 of the wiring line L is represented by:

$$P2 = 5Sa + Sb,$$

and P2 is larger than the pixel pitch (3Sa, or 2Sa+Sb).

As in the example shown in FIG. 6, by arranging one wiring line L for every two pixels (six subpixels), even if the wiring lines L are arranged in subpixels of a specific color, variation in width among the wiring lines L or misalignment of the wiring lines L during manufacturing exerts small influence on change in aperture ratio. For example, in the example shown in FIG. 6, although the wiring lines L are arranged in the blue subpixels 18B, the wiring lines L affect only half of the blue subpixels 18B among all the blue subpixels. Therefore, even if variation in width among the wiring lines L or misalignment of the wiring lines L occurs, the influence thereof on white balance is small as compared with a configuration in which wiring lines are arranged in all subpixels of a specific color as in the above-described conventional configuration.

Although one wiring line L is arranged for every two pixels in the example shown in FIG. 6, the wiring lines L may be arranged at a pitch corresponding to three or more pixels.

In the example shown in FIG. 6, the width Sb of each blue subpixel 18B with the wiring line L arranged therein is set to be larger than the width Sa of each subpixel 18 without the wiring line L arranged therein. Furthermore, it is preferable that the width Sb of each subpixel 18 with the wiring line L arranged therein, the width Sa of each subpixel 18 without the wiring line L arranged therein, and the width w of each wiring line L satisfy the following relational expression:

$$Sa = Sb - w.$$

According to this configuration, each subpixel 18 with the wiring line L arranged therein and each subpixel 18 without the wiring line L arranged therein can have the same aperture ratio. With this configuration, in addition to the effects of the first embodiment, it is possible to more effectively suppress streaky display unevenness observed when the aperture ratio varies among the subpixels depending on the presence or absence of the wiring line L in the subpixels.

However, in the present embodiment, it is not essential to set the width Sb of each blue subpixel 18B with the wiring line L arranged therein to be larger than the width Sa of each subpixel 18 without the wiring line L arranged therein. That is, in the third embodiment, the width of each blue subpixel 18B with the wiring line L arranged therein may be set to be the same as the width (Sa) of each subpixel 18 without the wiring line L arranged therein.

Fifth Embodiment

Figure 7:
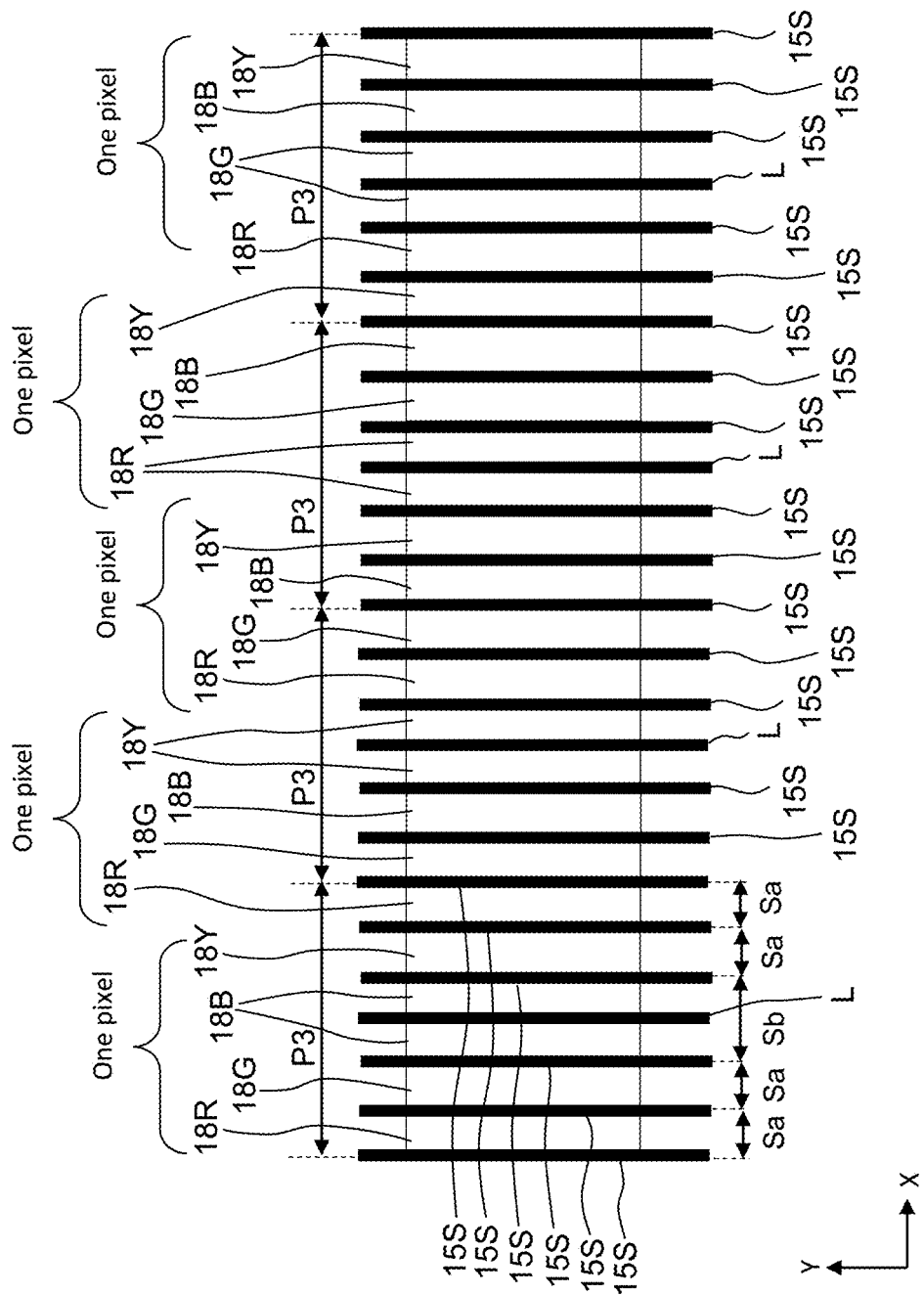
FIG. 7 is a schematic view showing the relative arrangement between pixels and wiring lines in a liquid crystal display device of a fifth embodiment.

FIG. 7 is a schematic view showing the relative arrangement between pixels and wiring lines in a liquid crystal display device of the fifth embodiment. Also in the fifth embodiment, the arrangement pitch of wiring lines L is set to be larger than the pixel pitch as in the first embodiment. However, in the fifth embodiment, subpixels of four colors of RGBY constitute one pixel. Furthermore, the fifth embodiment is different from the first embodiment in that one wiring line L is arranged for every five subpixels 18.

As shown in FIG. 7, in an active matrix substrate 20a of the fifth embodiment, subpixels 18 of respective colors of RGBY are arranged regularly in the extending direction of gate lines (the X direction in FIG. 7). One wiring line L is arranged for every five subpixels 18. That is, the arrangement pitch P3 of the wiring lines L in the present embodiment is set to a value larger than the pixel pitch. In the example shown in FIG. 7, the width Sb of each subpixel with the wiring line L arranged therein is set to be larger than the width Sa of each subpixel without the wiring line L arranged therein. The pixel pitch is represented by:

$$3Sa + Sb.$$

The arrangement pitch P3 of the wiring lines L is represented by:

$$4Sa + Sb,$$

which is larger than the pixel pitch.

In the example shown in FIG. 7, the arrangement pitch P3 of the wiring lines L is set to 4Sa+Sb. With this configuration, among five pixels that are adjacent to each other in the X direction in FIG. 7, in the leftmost pixel, the wiring line L is located in a blue subpixel 18B. In the second pixel from the left, the wiring line L is located in a yellow subpixel 18Y. In the third pixel from the left, the wiring line L is not arranged. In the second pixel from the right, the wiring line L is arranged in a red subpixel 18R. In the rightmost pixel, the wiring line L is located in a green subpixel 18G. Accordingly, as compared with a configuration in which wiring lines are arranged in pixels (subpixels) of a specific color as in the above-described conventional configuration, even if variation in width among the wiring lines L or misalignment of the wiring lines L occurs during manufacturing, the influence thereof on white balance is small because a similar degree of change is caused in the aperture ratios of the subpixels of the respective colors of RGBY.

In the example shown in FIG. 7, the width Sb of each subpixel 18 with the wiring line L arranged therein is set to be larger than the width Sa of each subpixel 18 without the wiring line L arranged therein. It is preferable that the width Sb of each subpixel 18 with the wiring line L arranged therein, the width Sa of each subpixel 18 without the wiring line L arranged therein, and the width w of each wiring line L satisfy the following relational expression:

$$Sa = Sb - w.$$

According to this configuration, each subpixel 18 with the wiring line L arranged therein and each subpixel 18 without the wiring line L arranged therein can have the same aperture ratio. With this configuration, in addition to the effects of the first embodiment, it is possible to more effectively suppress streaky display unevenness observed when the aperture ratio varies among the subpixels depending on the presence or absence of the wiring line L in the subpixels.

However, in the present embodiment, it is not essential to set the width Sb of each subpixel 18 with the wiring line L arranged therein to be larger than the width Sa of each subpixel 18 without the wiring line L arranged therein. That is, in the fifth embodiment, the width of each subpixel 18 with the wiring line L arranged therein may be set to be the same as the width (Sa) of each subpixel 18 without the wiring line L arranged therein.

Although FIG. 7 shows the configuration in which one pixel includes subpixels of four colors of RGBY as an illustrative example, one pixel may include subpixels of five or more colors.

Sixth Embodiment

Figure 8:
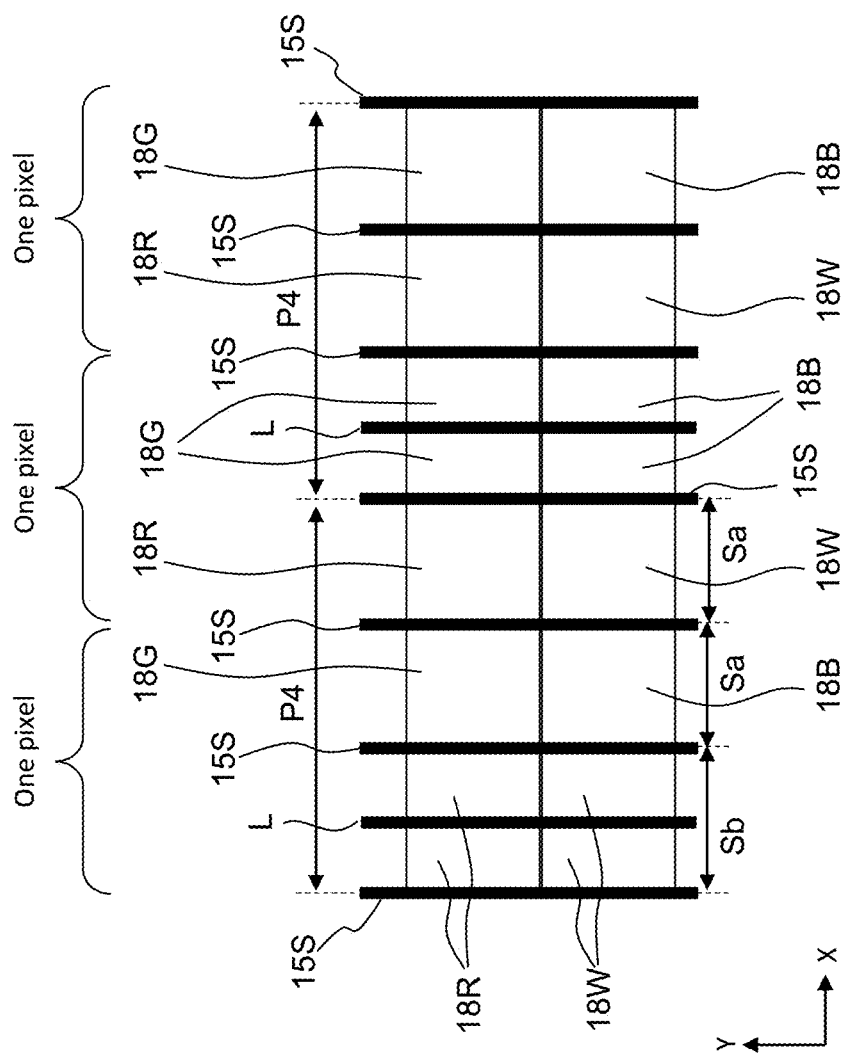
FIG. 8 is a schematic view showing the relative arrangement between pixels and wiring lines in a liquid crystal display device of a sixth embodiment.

FIG. 8 is a schematic view showing the relative arrangement between pixels and wiring lines in a liquid crystal display device of the sixth embodiment. The first to fifth embodiments each describe the configuration in which the color filters laid out in a stripe arrangement are provided as an illustrative example. In contrast, the sixth embodiment is directed to a configuration in which color filters laid out in a square arrangement are provided. The square arrangement is an arrangement in which a minimum unit of repetition of colors of the color filters includes two or more colors in the X direction and two or more colors in the Y direction.

For example, as shown in FIG. 8, in the sixth embodiment, subpixels of four colors of RGBW are laid out in two rows and two columns, thereby constituting one pixel. More specifically, in one pixel, a red (R) subpixel is arranged in the upper left, a white (W) subpixel is arranged in the lower left, a green (G) subpixel is arranged in the upper right, and a (blue) subpixel is arranged in the lower right. The color combination and arrangement of the subpixels are not limited to this example. For example, the arrangement may be an arrangement (the so-called Bayer arrangement) in which four subpixels of RGBG are laid out in two rows and two columns with the green (G) subpixels located diagonally opposite to each other.

One wiring line L is arranged for every three subpixels 18 in the X direction. That is, the arrangement pitch P4 of the wiring lines L in the present embodiment is set to a value larger than the pixel pitch. In the example shown in FIG. 8, the width Sb of each subpixel with the wiring line L arranged therein is set to be larger than the width Sa of each subpixel without the wiring line L arranged therein. The pixel pitch is represented by Sa+Sb or by 2Sa. The arrangement pitch P4 of the wiring lines L is represented by 2Sa+Sb, which is larger than the pixel pitch.

As in the example shown in FIG. 8, by arranging one wiring line L for every three subpixels, variation in width among the wiring lines L or misalignment of the wiring lines L during manufacturing exerts small influence on change in aperture ratio. For example, in the configuration shown in FIG. 8, the wiring line L on the left is arranged in a red subpixel 18R and a white subpixel 18. The wiring line L on the right is arranged in a green subpixel 18G and a blue subpixel 18B. Subsequently, this arrangement pattern appears repeatedly. Therefore, even if variation in width among the wiring lines L or misalignment of the wiring lines L occurs, the influence thereof on white balance is small as compared with a configuration in which wiring lines are arranged in all subpixels of a specific color as in the above-described conventional configuration.

Although one wiring line L is arranged for every three subpixels in the example shown in FIG. 8, the wiring lines L may be arranged at a pitch corresponding to three or more subpixels.

In the example shown in FIG. 8, the width Sb of each subpixel 18 with the wiring line L arranged therein is set to be larger than the width Sa of each subpixel 18 without the wiring line L arranged therein. It is preferable that the width Sb of each subpixel 18 with the wiring line L arranged therein, the width Sa of each subpixel 18 without the wiring line L arranged therein, and the width w of each wiring line L satisfy the following relational expression:

$$Sa=Sb-w.$$

According to this configuration, each subpixel 18 with the wiring line L arranged therein and each subpixel 18 without the wiring line L arranged therein can have the same aperture ratio. With this configuration, it is possible to more effectively suppress variation in white balance caused when the aperture ratio varies among the subpixels depending on the presence or absence of the wiring line L in the subpixels.

However, in the present embodiment, it is not essential to set the width Sb of each subpixel 18 with the wiring line L arranged therein to be larger than the width Sa of each subpixel 18 without the wiring line L arranged therein. That is, in the present embodiment, the width of each subpixel 18 with the wiring line L arranged therein may be set to be the same as the width (Sa) of each subpixel 18 without the wiring line L arranged therein.

Seventh Embodiment

A liquid crystal display device according to the present embodiment is configured such that elements constituting gate drivers are arranged in a pixel region. In this liquid crystal display device, wiring lines L are signal wiring lines to which gate clock signals for driving the gate drivers are supplied.

Figure 9:
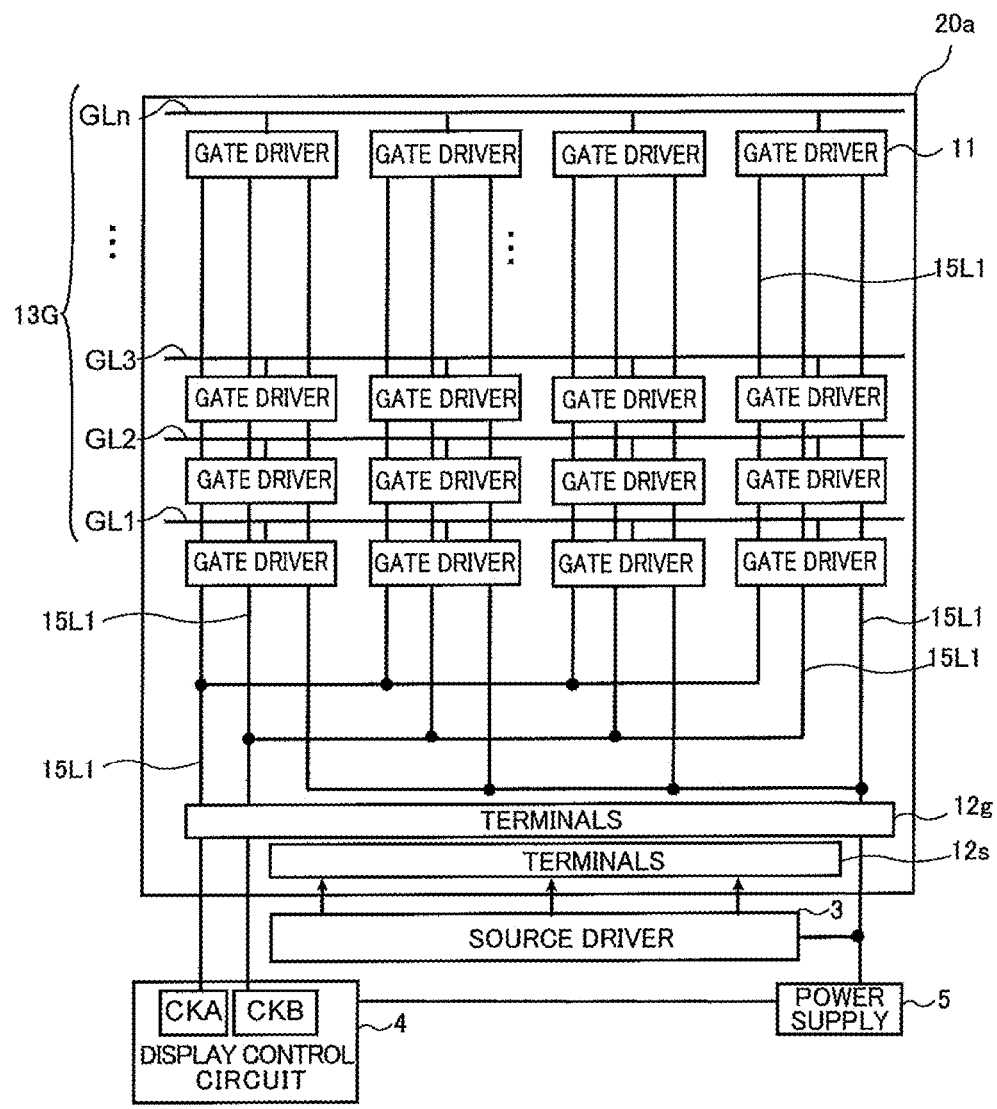
FIG. 9 is a top view showing schematic configurations of an active matrix substrate with source lines thereon omitted and components connected to the active matrix substrate in a liquid crystal display device according to a seventh embodiment.

FIG. 9 is a top view showing schematic configurations of an active matrix substrate 20a with source lines 15S thereon omitted and components connected to the active matrix substrate 20a in the liquid crystal display device according to the seventh embodiment.

As shown in the example shown in FIG. 9, gate drivers 11 are formed between two gate lines 13G and 13G that are adjacent to each other in the Y direction in a pixel region. In this example, four gate drivers 11 are connected to each of the gate lines 13G. It is to be noted, however, that the number of the gate drivers 11 connected to one gate line 13G is not limited thereto. In the pixel region of the active matrix substrate 20a, terminals 12g are provided in a frame region on the side where a source driver 3 is provided. The terminals 12g are connected to a control circuit 4 and a power supply 5. The terminals 12g receive signals output from the control circuit 4 and the power supply 5, such as control signals (CKA, CKB) and power supply voltage signals. The signals such as the control signals (CKA, CKB) and the power supply voltage signals input to the terminals 12g are supplied to the respective gate drivers 11 via the wiring lines 15L1. Each gate driver 11 outputs a voltage signal indicating either one of a selected state and a non-selected state to the gate line 13G connected to the gate driver 11 according to the signals supplied to the gate driver 11, and also outputs the voltage signal to the gate line 13G on the subsequent row. In the following description, a state where a gate line 13G is selected is referred to as a state where the gate line 13G is driven.

In the active matrix substrate 20a, terminals 12s for connecting the source driver 3 and the source lines 15S are provided in the frame region on the side where the source driver 3 is provided. The source driver 3 outputs a data signal to the respective source lines 15S according to the control signals input from the display control circuit 4.

As shown in FIG. 9, in the present embodiment, the plurality of gate drivers 11 are connected to each of the gate lines 13G of GL (1) to GL (n) in the pixel region. The gate drivers 11 connected to the same gate line 13G are synchronized with each other, and voltage signals output from these gate drivers 11 drive one gate line 13G simultaneously. In the present embodiment, the plurality of gate drivers 11 are connected to one gate line 13G at approximately regular intervals in order to make the loads applied to the respective gate drivers 11 for driving the gate line 13G substantially equal.

(Configuration of Gate Drivers)

Figure 10:
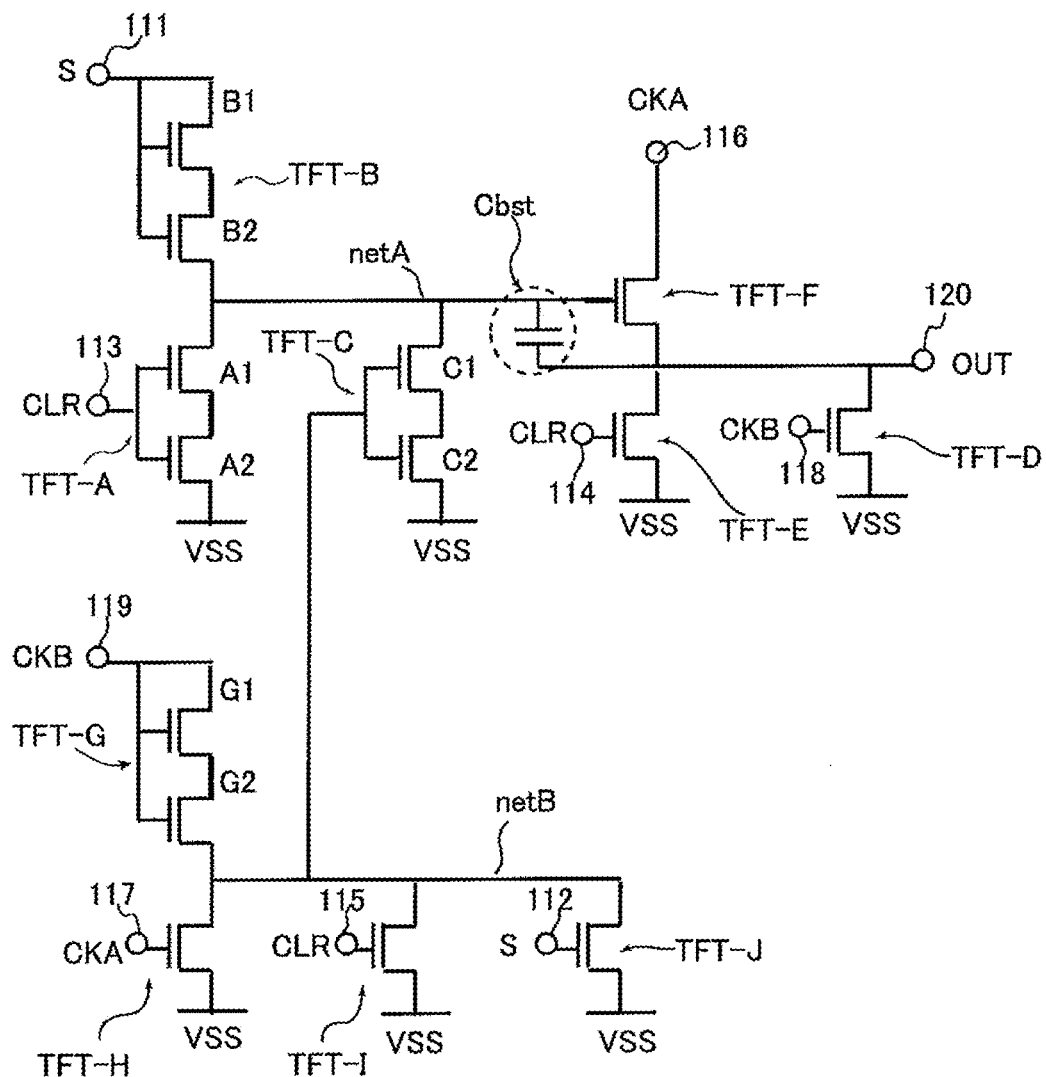
FIG. 10 is a diagram showing an example of an equivalent circuit of a gate driver in the seventh embodiment.

The configuration of the gate drivers 11 in the present embodiment will now be described. FIG. 10 is a diagram showing an example of an equivalent circuit of the gate driver 11 that is arranged between the gate lines 13G of GL (n-1) and GL (n-2) and drives the gate line 13G of GL (n-1). As shown in FIG. 10, the gate driver 11 includes TFT-A to TFT-J, which are constituted by thin film transistors (TFT), as switching elements, a capacitor Cbst, terminals 111 to 120, and a terminal group to which low-level power supply voltage signals are input.

The terminals 111 and 112 receive a set signal (S) via the gate line 13G on the preceding stage GL (n-2). Terminals 111 and 112 of each gate driver 11 connected to the gate line 13G of GL (1) receive a gate start pulse signal (S) output from the display control circuit 4. The terminals 113 to 115 receive a reset signal (CLR) output from the display control circuit 4. The terminals 116 and 117 receive a clock signal (CKA) input thereto. The terminals 118 and 119 receive a clock signal (CKB) input thereto. The terminal 120 outputs a set signal (OUT) to the gate line 13G on the subsequent row.

Figure 11:
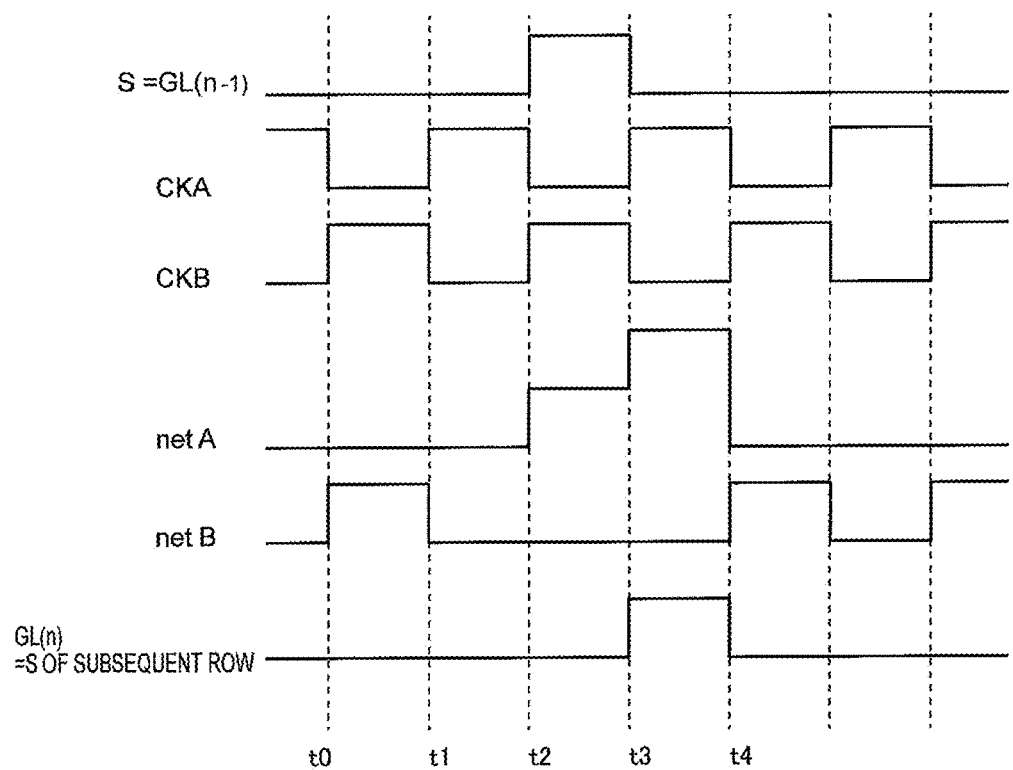
FIG. 11 is a timing chart showing waveforms of control signals supplied to gate drivers in the seventh embodiment.

The clock signal (CKA) and the clock signal (CKB) are two-phase clock signals whose phases are inverted for every one horizontal scanning period (see FIG. 11). FIG. 10 shows the gate driver 11 for driving the gate line 13G of GL (n-1) as an illustrative example. In the case of the gate driver 11 on the subsequent row for driving the gate line 13G of GL (n), terminals 116 and 117 receive a clock signal (CKB) and terminals 118 and 119 receive a clock signal (CKA). That is, the terminals 116 and 117 and the terminals 118 and 119 of each gate driver 11 receive clock signals whose phases are opposite to those of clock signals received by the gate drivers 11 on an adjacent row.

In FIG. 10, a wiring line to which a source terminal of the TFT-B, a drain terminal of the TFT-A, a source terminal of the TFT-C, one of electrodes of the capacitor Cbst, and a gate terminal of the TFT-F are connected is referred to as netA. A wiring line to which a gate terminal of the TFT-C, a source terminal of the TFT-G, a drain terminal of the TFT-H, a source terminal of the TFT-I, and a source terminal of TFT-J are connected is referred to as netB.

The TFT-A is constituted by two TFTs (A1 and A2) connected in series. Each gate terminal of the TFT-A is connected to the terminal 113, a drain terminal of the A1 is connected to the netA, and a source terminal of the A2 is connected to a power supply voltage terminal VSS.

The TFT-B is constituted by two TFTs (B1 and B2) connected in series. Each gate terminal of the TFT-B and a drain terminal of the B1 are connected (diode-connected) to the terminal 111, and a source terminal of the B2 is connected to the netA.

The TFT-C is constituted by two TFTs (C1 and C2) connected in series. Each gate terminal of the TFT-C is connected to the netB, a drain terminal of the C1 is connected to the netA, and a source terminal of the C2 is connected to the power supply voltage terminal VSS.

One of the electrodes of the capacitor Cbst is connected to the netA, and the other electrode is connected to the terminal 120.

In the TFT-D, a gate terminal is connected to the terminal 118, a drain terminal is connected to the terminal 120, and a source terminal is connected to the power supply voltage terminal VSS.

In the TFT-E, a gate terminal is connected to the terminal 114, a drain terminal is connected to the terminal 120, and a source terminal is connected to the power supply voltage terminal VSS.

In the TFT-F, the gate terminal is connected to the netA, a drain terminal is connected to the terminal 116, and a source terminal is connected to the output terminal 120.

The TFT-G is constituted by two TFTs (G1 and G2) connected in series. Each gate terminal of the TFT-G and a drain terminal of the G1 are connected (diode-connected) to the terminal 119, and a source terminal of the G2 is connected to the netB.

In the TFT-H, a gate terminal is connected to the terminal 117, the drain terminal is connected to the net B, and a source terminal is connected to the power supply voltage terminal VSS.

In the TFT-I, a gate terminal is connected to the terminal 115, a drain terminal is connected to the netB, and a source terminal is connected to the power supply voltage terminal VSS.

In the TFT-J, a gate terminal is connected to the terminal 112, a drain terminal is connected to the netB, and a source terminal is connected to the power supply voltage terminal VSS.

Although FIG. 10 shows an example in which the TFT-A, TFT-B, TFT-C, and TFT-G are each constituted by two TFTs connected in series, each of them may be constituted by one TFT.

Figure 12:
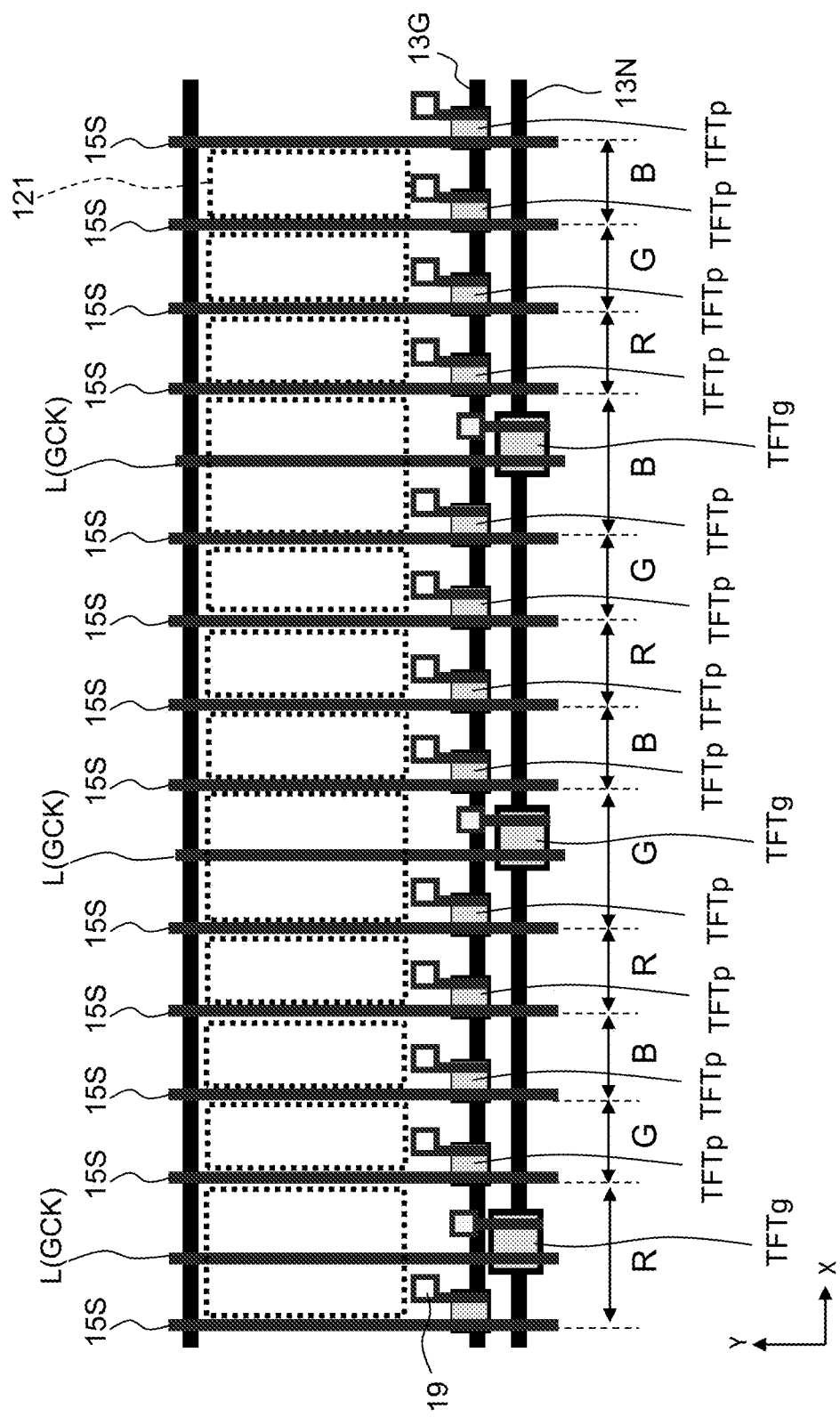
FIG. 12 is a schematic view showing a configuration of the active matrix substrate according to the seventh embodiment.

FIG. 12 is a schematic view showing a configuration of the active matrix substrate 20a according to the present embodiment. In the present embodiment, as described in the third embodiment, subpixels 18 of three colors of RGB constitute one pixel, and one wiring line L is arranged for every four subpixels 18. Also, the width Sb of each subpixel 18 with the wiring line L arranged therein is set to be larger than the width Sa of each subpixel 18 without the wiring line L arranged therein. In FIG. 12, regions 121 surrounded by broken lines are light-transmitting regions that transmit light. In the example shown in FIG. 12, the source lines 15S are arranged outside the light-transmitting regions 121 (regions where light is shielded by the black matrix between the subpixels), and the wiring lines L are arranged in the light-transmitting regions 121.

The wiring lines L shown in FIG. 12 correspond to the wiring lines 15L1 in FIGS. 9 to 10, to which the control signals and the power supply voltages (the clock signals CKA and CKB, CLR, and VSS) are supplied. In FIG. 12, the clock signals CKA and CKB are collectively represented as gate clock signals GCK. In FIG. 12, each TFTp is a pixel TFT for driving a subpixel, and is connected to the source line 15S and the gate line 13G. The TFTp is connected to a pixel electrode (not shown) of the subpixel via a contact hole 19. The TFTg's shown in FIG. 12 are switching elements constituting the gate driver 11. The three TFTg's shown in FIG. 12 correspond to any of the TFT-F, TFT-E, and TFT-D shown in FIG. 10. Each TFTg is connected to a net wiring line 13N, the wiring line L, and the gate line 13G. The net wiring line 13N corresponds to the netA, CLR, CKA, and CKB shown in FIG. 10.

As described above, in the configuration in which the switching elements (TFTg's) constituting the gate drivers 11 are arranged in the pixel region, by setting the arrangement pitch of the wiring lines L for supplying the control signals to the TFTg's to be larger than the pixel pitch, even if variation in width among the wiring lines L or misalignment of the wiring lines L occurs, the influence thereof on white balance is small.

In addition, by setting the width Sb of each subpixel 18 with the wiring line L for supplying the control signals to the TFTg arranged therein to be larger than the width Sa of each subpixel 18 without the wiring line L arranged therein, the difference in pixel aperture ratio between these subpixels is reduced. With this configuration, there is also an advantage in that streaky display unevenness caused by arranging the wiring lines L in the subpixels is not visually recognized.

In the example shown in FIG. 12, the source lines 15S are all arranged between the subpixels (the regions where light is shielded by the black matrix), and the wiring lines L are arranged in the subpixels (the light-transmitting regions). However, one or more of the source lines 15S may be arranged in the subpixel(s) (light-transmitting region(s)), and one or more of the wirings may be arranged between the subpixels (in the region(s) where light is shielded by the black matrix).

When the switching elements (TFTg's) constituting the gate drivers 11 are arranged in the pixel region as in the present embodiment, the parasitic capacitance increases. Accordingly, it is preferable to use a high mobility TFT such as an oxide semiconductor. That is, it is preferable that each TFTg is provided with an oxide semiconductor film. The oxide semiconductor film may contain at least one metallic element selected from In, Ga, and Zn, for example. The oxide semiconductor film contains an In—Ga—Zn—O semiconductor, for example. The In—Ga—Zn—O semiconductor is a ternary oxide composed of In (indium), Ga (gallium), and Zn (zinc). The ratio of In, Ga, and Zn (composition ratio) is not particularly limited, and examples thereof include In:Ga:Zn=2:2:1, In:Ga:Zn=1:1:1, and In:Ga:Zn=1:1:2. Such an oxide semiconductor film can be formed of an oxide semiconductor film containing an In—Ga—Zn—O semiconductor. A channel-etch type TFT provided with an active layer containing an In—Ga—Zn—O semiconductor may be referred to as "CE-InGaZnO-TFT". The In—Ga—Zn—O semiconductor may be either amorphous or crystalline. As a crystalline In—Ga—Zn—O semiconductor, it is preferable to use a crystalline In—Ga—Zn—O semiconductor with its c-axis oriented substantially perpendicular to the layer surface.

The present embodiment shows, as an illustrative example, the configuration in which the arrangement of the wiring lines L in the above-described third embodiment is applied to the wiring lines 15L1 for supplying the control signals to the switching elements (TFTg's) of the gate drivers 11 in the pixel region. It is to be noted, however, that not only the arrangement of the wiring lines L in the third embodiment but also the arrangement of the wiring lines L in the first embodiment or any of fourth to sixth embodiments is also applicable to the wiring lines 15L1.

Eighth Embodiment

Figure 13:
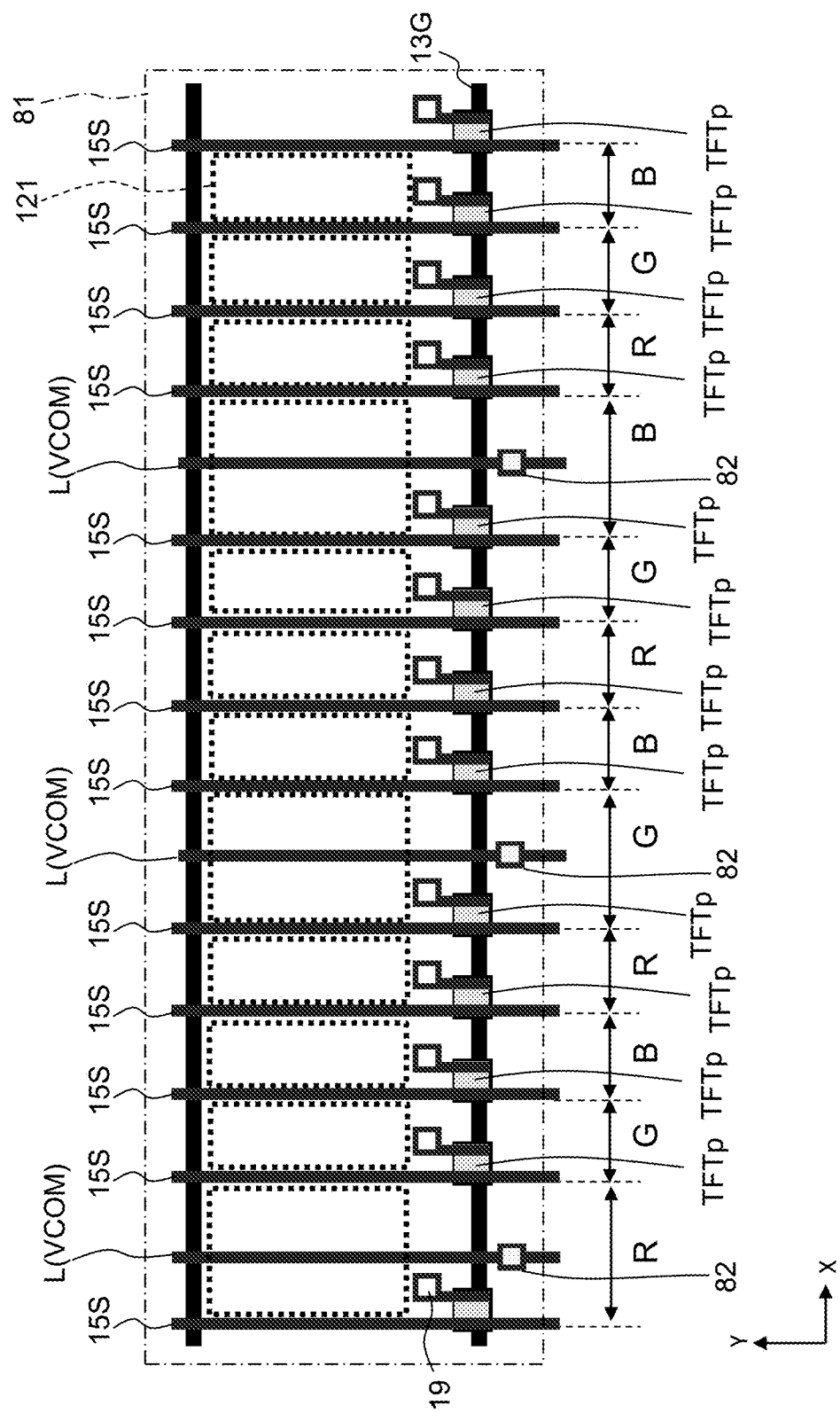
FIG. 13 is a schematic view showing the relative arrangement between pixels and wiring lines in a liquid crystal display device of an eighth embodiment.

FIG. 13 is a schematic view showing the relative arrangement between pixels and wiring lines in a liquid crystal display device of the eighth embodiment. The liquid crystal display device according to the present embodiment is a liquid crystal display device of a fringe field switching (FFS) mode.

As shown in FIG. 13, the liquid crystal display device according to the present embodiment includes, on an active matrix substrate 20a, a common electrode 81 formed over the entire surface of a pixel region. The common electrode 81 is formed of a transparent conductive material such as ITO, and is laminated over pixel electrodes of subpixels 18 via an insulating film (not shown). Although not shown in FIG. 13, the pixel electrodes of the subpixels 18 each have a slit. An electric field is generated in the horizontal direction (direction parallel to the substrate) between the common electrode 81 and the pixel electrodes of the subpixels 18, whereby liquid crystals are driven.

In the present embodiment, wiring lines L are wiring lines for applying a voltage (VCOM) to the common electrode 81. As shown in FIG. 13, the wiring lines L are connected to the common electrode 81 via contact holes 82 that pass through the insulating film. The voltage applied to the common electrode 81 via the wiring lines L may be a constant voltage, or may be a voltage whose polarity is inverted for every frame period, for example.

In the example shown in FIG. 13, as described in the third embodiment, the subpixels 18 of three colors of RGB constitute one pixel, and one wiring line L is arranged for every four subpixels 18. The width Sb of each subpixel 18 with the wiring line L arranged therein is set to be larger than the width Sa of each subpixel 18 without the wiring line L arranged therein.

By setting the arrangement pitch of the wiring lines L for supplying a voltage to the common electrode 81 to be larger than the pixel pitch as described above, even if variation in width among the wiring lines L or misalignment of the wiring lines L occurs, the influence thereof on white balance is small.

In addition, by setting the width Sb of each subpixel 18 with the wiring line L for supplying a voltage to the common electrode 81 arranged therein to be larger than the width Sa of each subpixel 18 without the wiring line L arranged therein, the difference in pixel aperture ratio between these subpixels is reduced. With this configuration, there is also an advantage in that streaky display unevenness caused by arranging the wiring lines L in the subpixels is not visually recognized.

The present embodiment shows, as an illustrative example, the configuration in which the arrangement of the wiring lines L in the above-described third embodiment is applied to the wiring lines for supplying a voltage to the common electrode 81. It is to be noted, however, that not only the arrangement of the wiring lines L in the third embodiment but also the arrangement of the wiring lines L in the first embodiment or any of fourth to sixth embodiments is also applicable to the wiring lines for supplying a voltage to the common electrode 81.

A COM driver for driving the wiring lines L for supplying a voltage to the common electrode 81 may be provided outside the pixel region (i.e., in the frame region). Alternatively, at least one of switching elements constituting the COM driver may be provided in the pixel region, similarly to the case of the gate drivers 11 described in the seventh embodiment.

Ninth Embodiment

Figure 14:
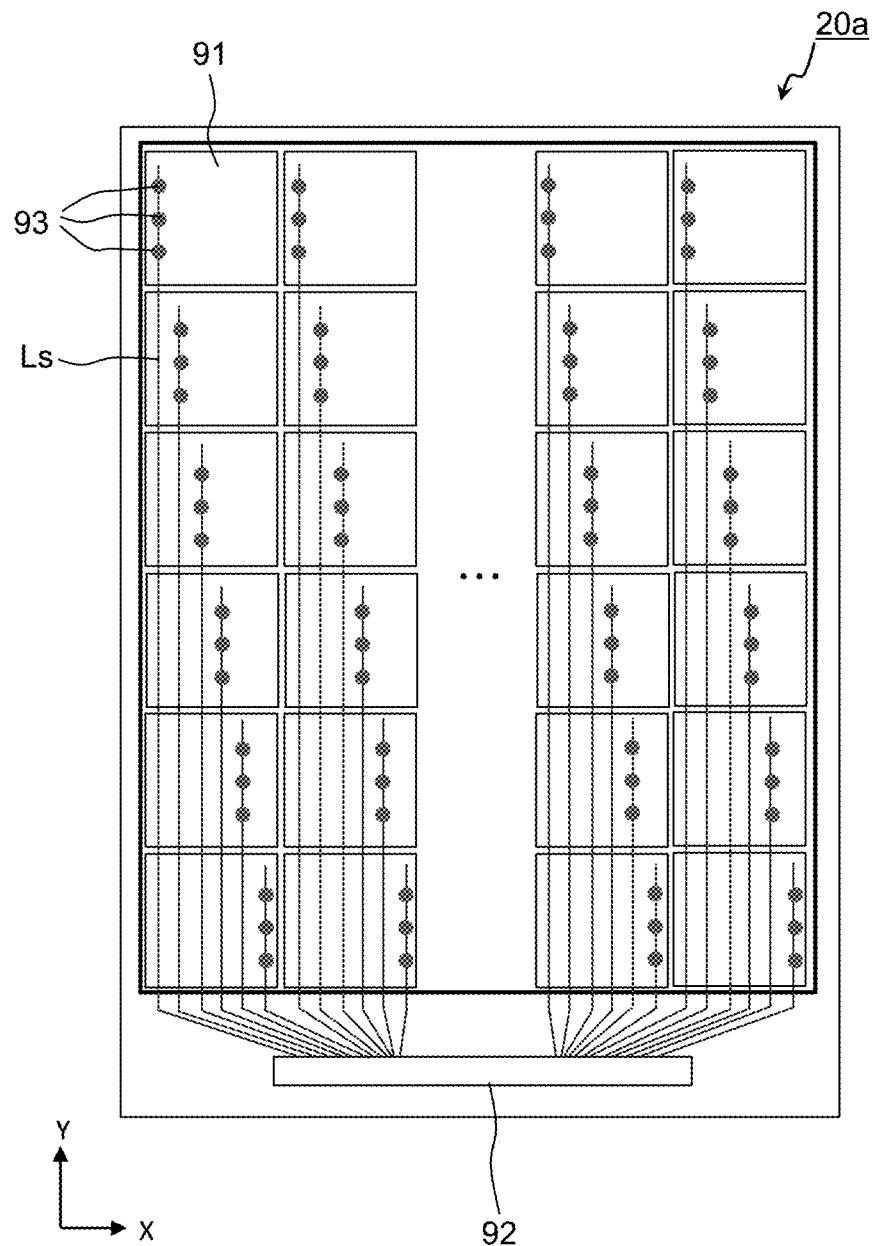
FIG. 14 is a schematic view showing a configuration provided for detecting touch operations in a liquid crystal display device according to a ninth embodiment.

A liquid crystal display device according to the ninth embodiment is a liquid crystal display device provided with a touch panel. FIG. 14 is a schematic view showing a configuration provided for detecting touch operations in the liquid crystal display device according to the present embodiment.

As shown in FIG. 14, an active matrix substrate 20*a* of the present embodiment is provided with segmented common electrodes 91 (touch electrodes). The plurality of common electrodes 91, which are formed of a transparent conductive material such as ITO, are provided in a pixel region. The size of the common electrodes 91 can be set freely, and in general, one common electrode 91 corresponds to a plurality of pixels. As will be described below, the common electrodes 91 function as a touch sensor during operation of the touch panel (sensing period), and function as counter electrodes facing pixel electrodes of subpixels 18 during an image display period.

A sensor driver 92 is provided in a frame region of the active matrix substrate 20*a*. The sensor driver 92 may be incorporated in a source driver 3 (see FIG. 1 etc.). To the sensor driver 92, a plurality of sensor wiring lines Ls provided in parallel with source lines 15S (not shown in FIG. 14) are connected. Each sensor wiring line Ls is connected to each common electrode 91 via contact holes 93. With this configuration, a signal is supplied from the sensor driver 92 to the common electrodes 91 via the sensor wiring lines Ls. Although the example shown in FIG. 14 is directed to the configuration in which each sensor wiring line Ls is connected to each common electrode 91 via a plurality of (three in this example) contact holes 93, the number of the contact holes 93 may be one or two, or may be four or more.

Figure 15:
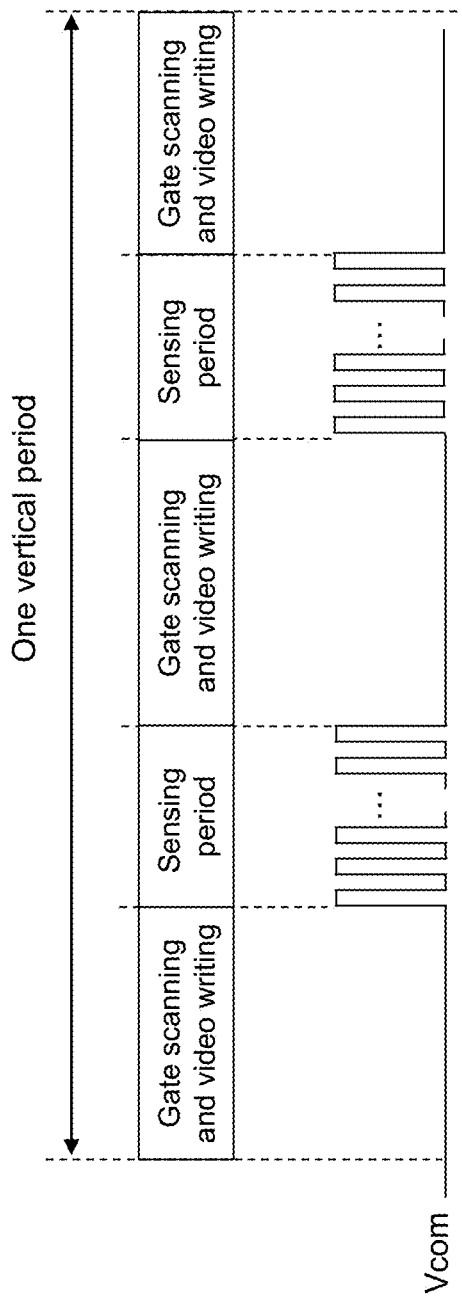
FIG. 15 is a timing chart showing a general outline of operations of the liquid crystal display device according to the ninth embodiment.

FIG. 15 is a timing chart showing a general outline of operations of the liquid crystal display device according to the present embodiment. As shown in FIG. 15, one vertical period includes a plurality of sensing periods in periods when writing of an image signal is not performed. That is, in the periods when writing of an image signal is performed, gate lines 13G are driven sequentially and the image signal is written to the source lines 15S, whereby an image is displayed. In these periods, a constant voltage Vcom is supplied to the sensor wiring lines Ls, whereby the potentials of the common electrodes 91 are maintained constant. As a result, potential differences corresponding to the image signal written to the source lines 15S are generated between the pixel electrodes of the subpixels 18 and the common electrodes 91, whereby orientation of liquid crystals is controlled.

On the other hand, in the sensing periods, the gate lines 13G are not driven, and an AC signal having a constant amplitude is supplied to the sensor wiring lines Ls. When a person's finger or a pen touches a display screen, a capacitance is formed between the person's finger or pen and the common electrode 91, and as a result, the capacitance of the common electrode 91 increases. In the sensing periods, the sensor driver 92 supplies a touch driving signal to the common electrodes 91 via the sensor wiring lines Ls, and receives a touch detection signal similarly via the sensor wiring lines Ls. With this configuration, by detecting a change in capacitance in the plurality of common electrodes 91, it is possible to determine which of the plurality of common electrodes 91 is touched. That is, the sensor wiring lines Ls function as wiring lines for transmitting and receiving a touch driving signal and a touch detection signal.

Figure 16:
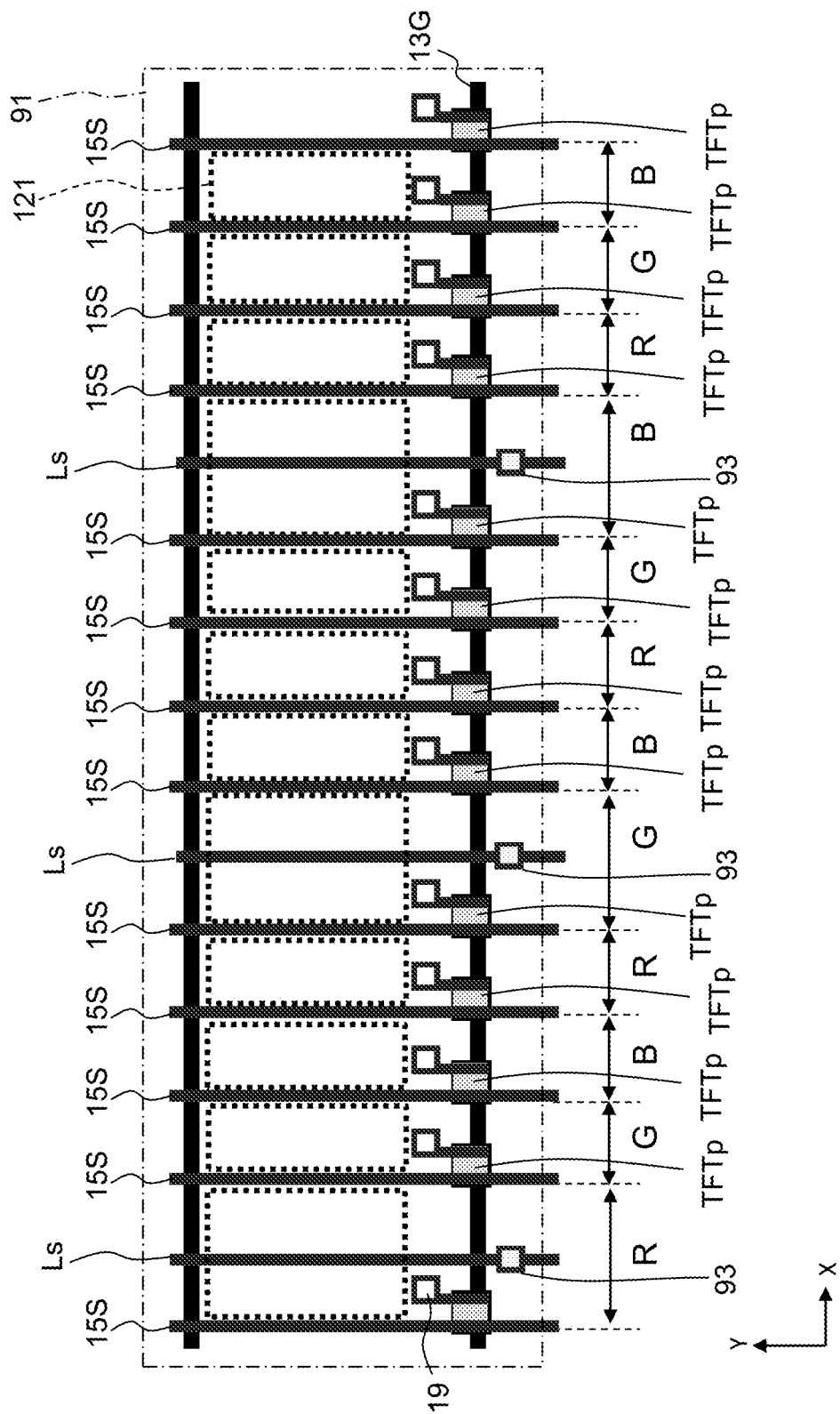
FIG. 16 is a schematic view showing the relative arrangement between pixels and wiring lines in the liquid crystal display device of the ninth embodiment.

In the present embodiment, the sensor wiring lines Ls correspond to the wiring lines L described in the third embodiment. That is, as shown in FIG. 16, also in this embodiment, the subpixels 18 of three colors of RGB constitute one pixel, and one wiring line L is arranged for every four subpixels 18. Also, the width Sb of each subpixel 18 with the sensor wiring line Ls arranged therein is set to be larger than the width Sa of each subpixel 18 without the sensor wiring line Ls arranged therein.

By setting the arrangement pitch of the sensor wiring lines Ls to be larger than the pixel pitch as described above, even if variation in width among the sensor wiring lines L or misalignment of the sensor wiring lines L occurs, the influence thereof on white balance is small.

In addition, by setting the width Sb of each subpixel 18 with the sensor wiring line Ls arranged therein to be larger than the width Sa of each subpixel 18 without the sensor wiring line Ls arranged therein, the difference in pixel aperture ratio between these subpixels is reduced. With this configuration, there is also an advantage in that streaky display unevenness caused by arranging the sensor wiring lines Ls in the subpixels is not visually recognized.

The present embodiment shows, as an illustrative example, the configuration in which the arrangement of the wiring lines L in the above-described third embodiment is applied to the sensor wiring lines Ls. It is to be noted, however, that not only the arrangement of the wiring lines L in the third embodiment but also the arrangement of the wiring lines L in the first embodiment or any of fourth to sixth embodiments is also applicable to the sensor wiring lines Ls.

Tenth Embodiment

A liquid crystal display device according to the tenth embodiment is configured such that gate drivers are arranged at one end of a frame region in an active matrix substrate in the extending direction of source lines (Y direction), and wiring lines L connect the gate drivers and gate lines 13G.

Figure 17:
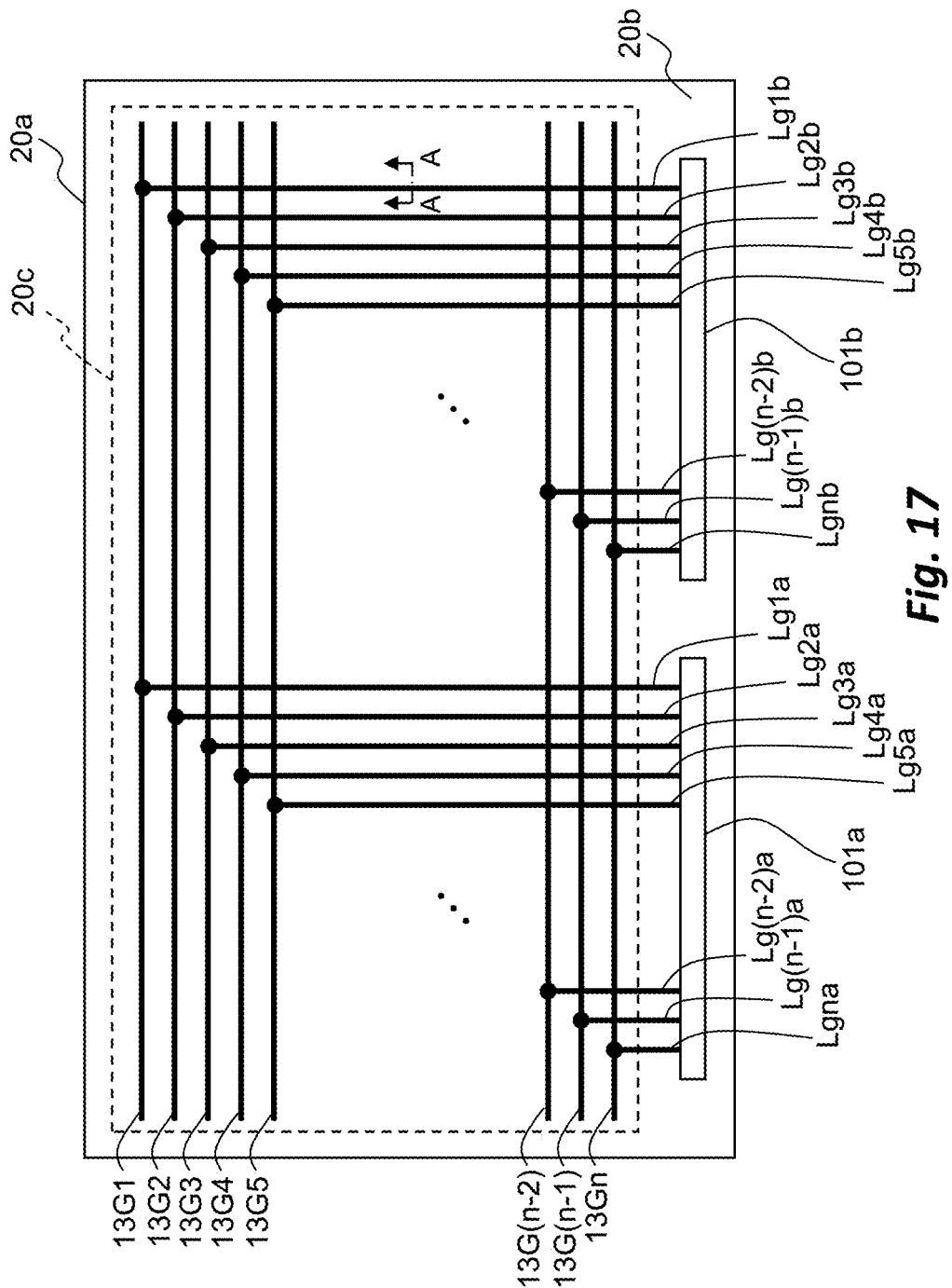
FIG. 17 is a schematic view showing a schematic configuration of a liquid crystal display device according to a tenth embodiment.

FIG. 17 is a schematic view showing the arrangement of the gate drivers, the gate lines, and the wiring lines that connect the gate drivers and the gate lines in the liquid crystal display device according to the tenth embodiment. In FIG. 17, source lines 15S etc. are not shown. As shown in FIG. 17, in the liquid crystal display device according to the tenth embodiment, gate drivers 101*a* and 101*b* are provided at one end of a frame region 21 in an active matrix substrate 20*a* in the extending direction of the source line 15S (Y direction). The frame region 21 is a region that is outside a pixel region 22 indicated by a broken line in FIG. 17. Although not shown in FIG. 17, similarly to the gate drivers 101*a* and 101*b*, a source driver 3 is also provided at one end of the frame region in the extending direction of the source line 15S (Y direction).

The gate driver 101*a* and the gate lines 13G are connected to each other by wiring lines Lg that extend along the Y direction. More specifically, n gate lines $13G_1$ to $13G_n$ are provided on the active matrix substrate 20*a*, and these gate lines $13G_1$ to $13G_n$ are connected to the gate driver 101*a* by wirings lines $Lg_{1a}$ to $Lg_{na}$, respectively. Similarly, the gate driver 101*b* and the gate lines 13G are connected to each other by wiring lines Lg that extend along the Y direction.

More specifically, the gate lines $13G_1$ to $13G_n$ are connected to the gate driver 101*b* by wiring lines $Lg_{1b}$ to $Lg_{nb}$, respectively.

The gate driver 101*a* selects the gate lines $13G_1$ to $13G_n$ sequentially. The gate driver 101*b* operates in synchronization with the gate driver 101*a*, and outputs the same signal as that output from the gate driver 101*a* to the gate lines $13G_1$ to $13G_n$. By driving each of the gate lines $13G_1$ to $13G_n$ using the two gate drivers 101*a* and 101*b* as described above, there is an effect that waveform rounding of signals on the gate lines 13G is suppressed. This effect is particularly notable when the display area is large (i.e., when the gate lines 13G are long).

Although the present embodiment shows the configuration in which two gate drivers are provided as an illustrative example, three or more gate drivers may be provided. When waveform rounding of signals on the gate lines 13G is not perceived as a problem, only one gate driver may be provided. When a plurality of gate drivers are provided, the gate drivers may be arranged so as to be distributed at both ends of the active matrix substrate 20*a* in the Y direction.

Figure 18:
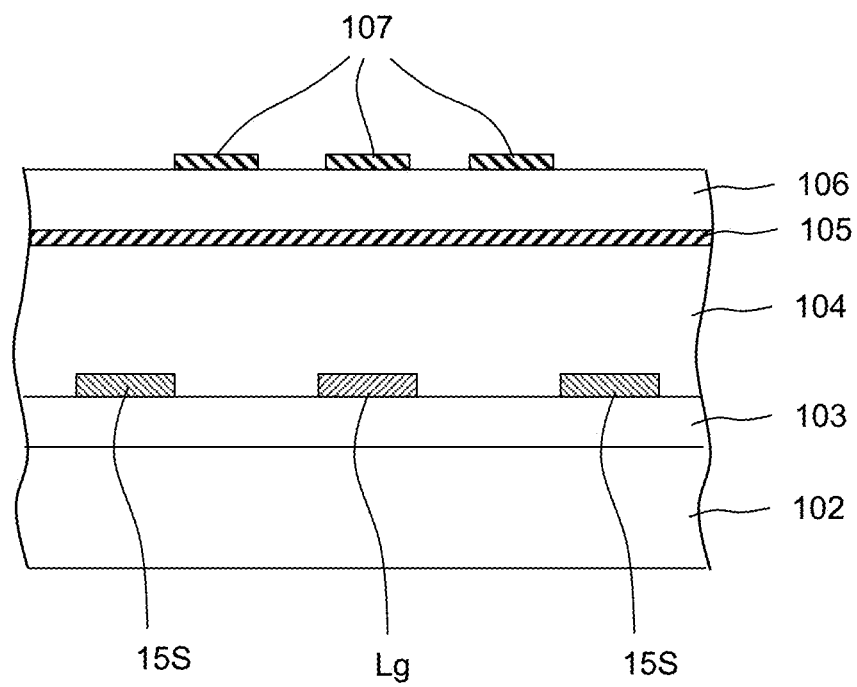
FIG. 18 is a cross-sectional view taken along line A-A in FIG. 17.

FIG. 18 is a cross-sectional view taken along line A-A in FIG. 17. As shown in FIG. 18, a wiring line Lg and source lines 15S are arranged in the same layer, and the wiring line Lg is located in a region overlaid with pixel electrodes 107 between the two adjacent source lines 15S. The wiring lines Lg may be formed simultaneously with the source lines 15S using the same material as the source lines 15S, or may be formed using a material different from the material of the source lines 15S by a process different from a process for forming the source lines 15S. The gate lines 15G, which do not appear in the cross section shown in FIG. 18, are formed in a layer (between a glass substrate 102 and a gate insulating film 103) different from the layer in which the wiring lines Lg and the source lines 15S are formed. Accordingly, in the pixel region, the gate lines 15G and the wiring lines Lg are connected to each other via contact holes (reference numeral 96 in FIG. 19) formed in the gate insulating film 103.

In FIG. 18, reference numeral 102 denotes the glass substrate of the active matrix substrate 20*a*, reference numeral 103 denotes the gate insulating film, reference numeral 105 denotes a common electrode, and 107 denotes the pixel electrodes. The driving mode of the liquid crystal display device shown in FIG. 18 is a mode in which liquid crystals are driven by generating an in-plane electric field, such as the above-described fringe field switching (FFS) mode, and the common electrode 105 functions as a counter electrode facing the pixel electrodes 107. The pixel electrodes 107 each have a slit 107*s*. It is to be noted, however, that the driving mode of the liquid crystal display device of the present embodiment is not limited thereto. Reference numeral 104 denotes an insulating film for insulating the source lines 15S and the wiring lines Lg from the common electrode 105. Reference numeral 106 denotes an insulating film for insulation between the common electrode 105 and the pixel electrodes 107.

As described above, in the present embodiment, the gate drivers 101 are arranged at one end of the active matrix substrate 20*a* in the Y direction. Accordingly, as compared with a configuration in which a gate driver is arranged at an end portion in the X direction, the area of the frame region at an end portion of the active matrix substrate 20*a* in the X direction can be made smaller. This is also advantageous in that the degree of freedom in shape of the end portion in the X direction of the active matrix substrate 20*a* is increased, which allows a deformed panel (a panel other with a shape other than a rectangle) to be designed easy.

Figure 19:
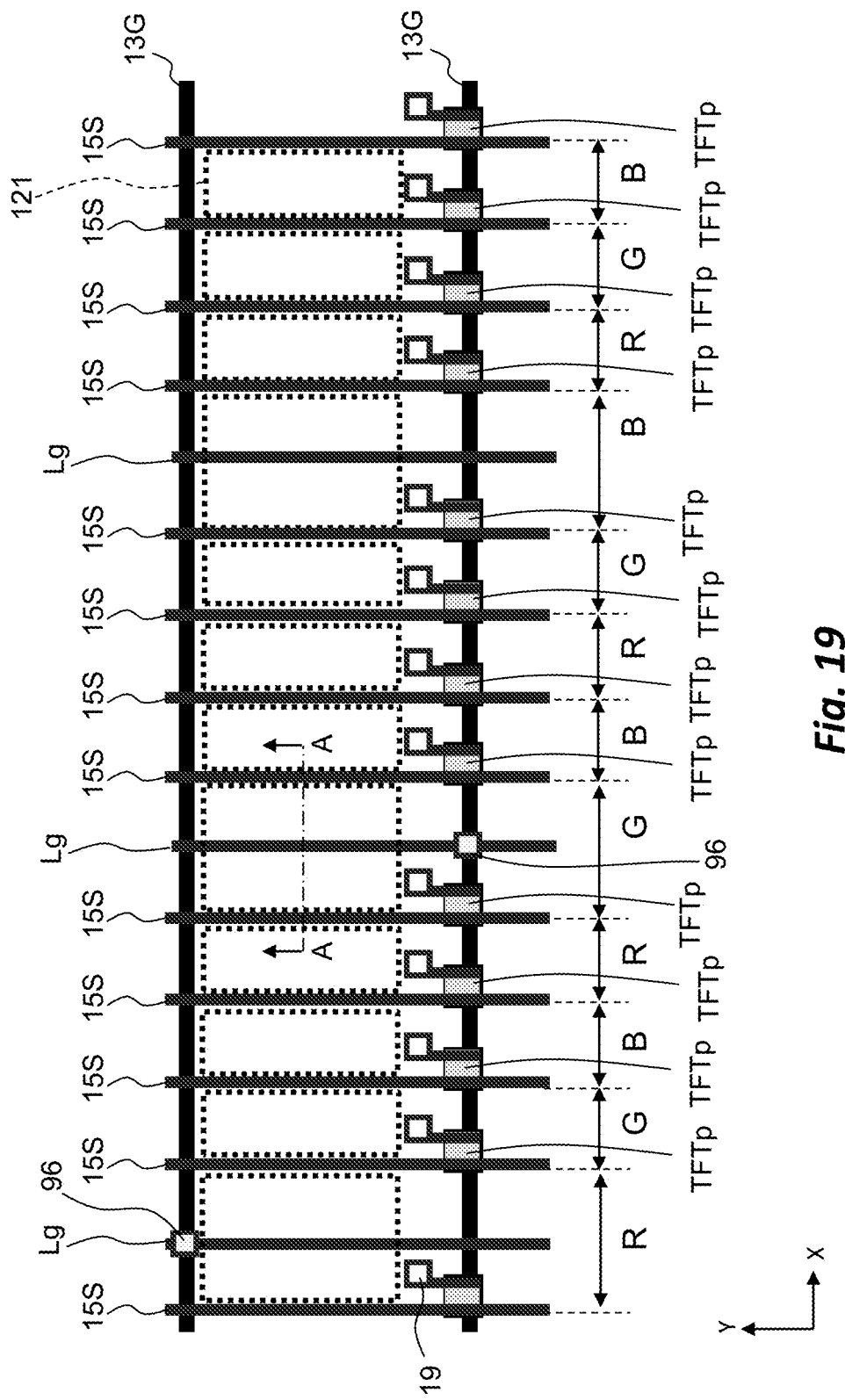
FIG. 19 is a schematic view showing the relative arrangement between pixels and wiring lines in the liquid crystal display device of the tenth embodiment.

In the present embodiment, the wiring lines Lg that connect the gate drivers 101 and the gate lines 13G correspond to the wiring lines L described in the third embodiment. FIG. 19 is a schematic view showing the relative arrangement between pixels and the wiring lines in the liquid crystal display device of the tenth embodiment. Also in FIG. 19, line A-A along which the cross section of FIG. 18 is taken is shown. As shown in FIG. 19, also in the present embodiment, the subpixels 18 of three colors of RGB constitute one pixel, and one wiring line L is arranged for every four subpixels 18. Also, the width Sb of each subpixel 18 with the wiring line Lg arranged therein is set to be larger than the width Sa of each subpixel 18 without the wiring line Lg arranged therein.

By setting the arrangement pitch of the wiring lines Lg to be larger than the pixel pitch as described above, even if variation in width among the wiring lines Lg or misalignment of the wiring lines Lg occurs, the influence thereof on white balance is small.

In addition, by setting the width Sb of each subpixel 18 with the wiring line Lg arranged therein to be larger than the width Sa of each subpixel 18 without the wiring line Lg arranged therein, the difference in pixel aperture ratio between these subpixels is reduced. With this configuration, there is also an advantage in that streaky display unevenness caused by arranging the wiring lines Lg in the subpixels is not visually recognized.

The present embodiment shows, as an illustrative example, the configuration in which the arrangement of the wiring lines L in the above-described third embodiment is applied to the wiring lines Lg. It is to be noted, however, that not only the arrangement of the wiring lines L in the third embodiment but also the arrangement of the wiring lines L in the first embodiment or any of fourth to sixth embodiments is also applicable to the wiring lines Lg.

Although the display device according to the present invention has been described above by way of illustrative embodiments, the configuration of the display device according to the present invention is not limited to those described in the above-described embodiments and may be modified in various ways.

For example, in each of the above-described embodiments, the configuration in which the wiring lines L are provided in parallel with the source lines 15S is shown as an illustrative example. However, the wiring lines L may be provided in parallel with the gate lines 13G.

For example, in FIG. 18 relating to the tenth embodiment, the configuration in which the wiring lines L (wiring lines Lg) and the source lines 15S are arranged in the same layer is shown as an illustrative example. Also in other embodiments, the wiring lines L and the source lines 15S may be formed in the same layer as in FIG. 18, or the wiring lines L and the source lines 15S may be formed in different layers.

Figure 20:
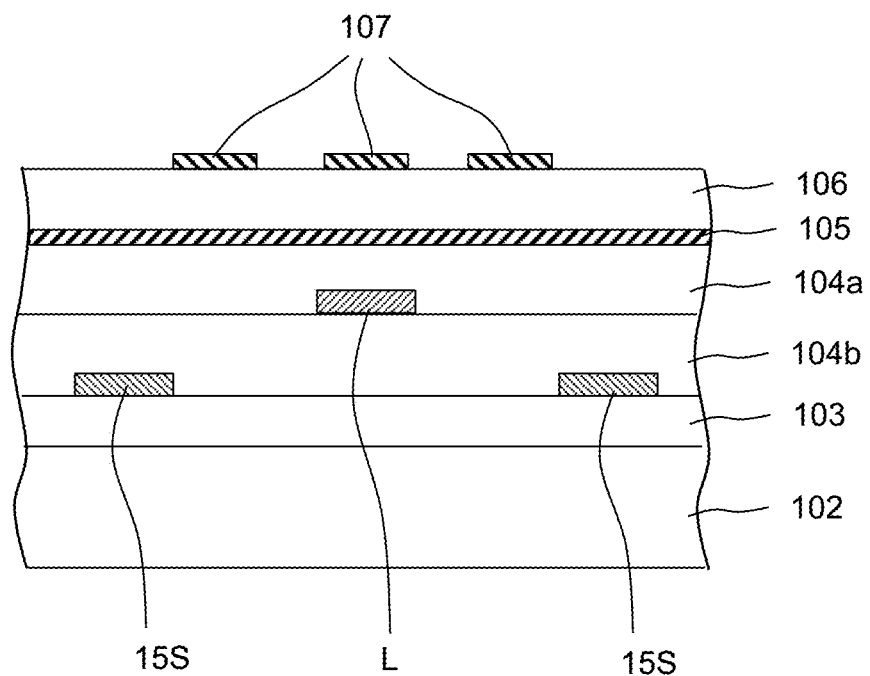
FIG. 20 is a cross-sectional view showing an example of a configuration in which wiring lines are formed in a layer located above a layer in which source lines are formed.

For example, FIG. 20 shows an example of the configuration in which wiring lines L are formed in a layer located above a layer in which source lines 15S are formed. In the configuration shown in FIG. 20, two insulating films 104*a* and 104*b* are provided between the source lines 15S and a common electrode 105, and the wiring lines L are provided between these insulating films 104*a* and 104*b*.

Figure 21:
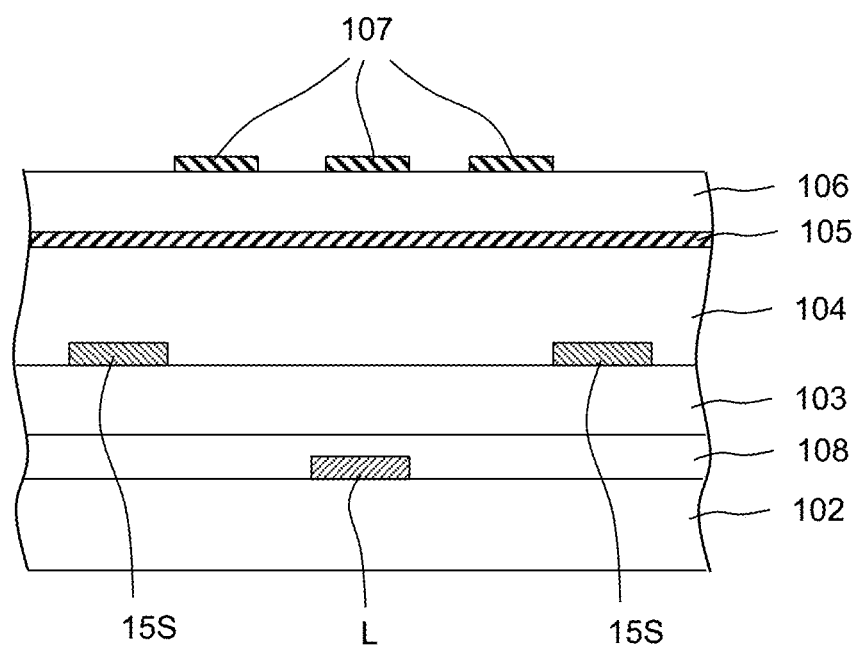
FIG. 21 is a cross-sectional view showing an example of a configuration in which wiring lines are formed in a layer located below a layer in which source lines are formed.

FIG. 21 shows an example of the configuration in which wiring lines L are formed in a layer located below a layer in which source lines 15S are formed. In the configuration shown in FIG. 21, an insulating film 108 is provided between a glass substrate 102 and a gate insulating film 103, and the wiring lines L are arranged between the insulating film 108 and the glass substrate 102.

By forming the wiring lines L in the layer different from the layer in which the source lines 15S are formed as described above, the parasitic capacitance between the wiring lines L and the source lines 15S is reduced, thereby allowing further improvement in display quality.

The above-described plurality of embodiments may be used in any desired combination. For example, the seventh to ninth embodiments may be used in combination to provide a configuration in which wiring lines L are used as any of wiring lines for supplying control signals to TFTg's (seventh embodiment), wiring lines for supplying signals to a common electrode (eighth embodiment), and sensor wiring lines for a touch panel (the ninth embodiment).

Each of the above-described embodiments has described an example where the liquid crystal display device of the present invention is a liquid crystal display device. However, the present invention is also applicable to display devices other than a liquid crystal display device (e.g., organic electroluminescence (EL) displays and the like).

REFERENCE SIGNS LIST

1: Liquid crystal display device
2: Display panel
3: Source driver
4: Display control circuit
5: Power supply
13G: Gate line
15S: Source line
18: Subpixel
20a: Active matrix substrate
20b: Counter substrate
L: Wiring line

The invention claimed is:

1. A display device comprising:
   gate lines;
   source lines;
   drive elements connected to the gate lines and the source lines;
   pixel electrodes connected to the drive elements; and
   color filters of a plurality of colors provided corresponding to the pixel electrodes,
   the pixel electrodes being provided in one-to-one correspondence with subpixels,
   a plurality of subpixels of the plurality of colors constituting one pixel, wherein
   the display device further includes wiring lines provided in a pixel region so as to extend along either the gate lines or the source lines,
   at least some of the wiring lines are arranged in pixel aperture regions of the subpixels, and
   an arrangement pitch of the wiring lines is larger than a pixel pitch.

2. The display device according to claim 1, wherein the wiring lines are arranged in the pixel aperture regions of the subpixels of all of the plurality of colors.

3. The display device according to claim 1, wherein the wiring lines are arranged in the pixel aperture regions of the subpixels of a specific color among the plurality of colors.

4. The display device according to claim 1, further comprising a black matrix provided corresponding to regions where the gate lines and the source lines are formed,
   wherein, in each subpixel with the wiring line arranged therein, at least one of a black matrix opening length and a black matrix opening width is greater than that in each subpixel without the wiring line arranged therein.

5. The display device according to claim 1, wherein a size of each subpixel with the wiring line arranged therein in a width direction of the wiring line is greater than that of each subpixel without the wiring line arranged therein.

6. The display device according to claim 1, wherein the color filters are laid out in a stripe arrangement.

7. The display device according to claim 1, wherein a minimum unit of repetition of colors of the color filters includes at least two colors in an extending direction of the source lines and at least two colors in an extending direction of the gate lines.

8. The display device according to claim 1, further comprising a gate driver for driving the gate lines,
   wherein at least one of switching elements included in the gate driver are arranged in the pixel region, and
   at least one of the wiring lines are connected to the switching elements.

9. The display device according to claim 8, wherein the switching elements included in the gate driver are each provided with an oxide semiconductor film.

10. The display device according to claim 1, further comprising a common electrode facing the pixel electrodes,
    wherein at least one of the wiring lines are connected to the common electrode.

11. The display device according to claim 1, further comprising a touch electrode for touch detection,
    wherein at least one of the wiring lines are connected to the touch electrode.

12. The display device according to claim 1, further comprising a gate driver for driving the gate lines,
    wherein the gate driver is arranged outside the pixel region in an extending direction of the source lines, and
    at least one of the wiring lines connect the gate driver and the gate lines.

13. The display device according to claim 1, wherein the source lines and the wiring lines are formed in the same layer.

14. The display device according to claim 1, wherein the source lines and the wiring lines are formed in different layers.

15. The display device according to claim 1, wherein the drive elements are each provided with an oxide semiconductor film.

* * * * *